United States Patent
Murtuza et al.

(10) Patent No.: US 11,171,126 B2
(45) Date of Patent: Nov. 9, 2021

(54) CONFIGURABLE SUBSTRATE AND SYSTEMS

(71) Applicant: Octavo Systems LLC, Sugar Land, TX (US)

(72) Inventors: Masood Murtuza, Sugar Land, TX (US); Gene Alan Frantz, Sugar Land, TX (US); Neeraj Kumar Reddy Dantu, Houston, TX (US)

(73) Assignee: OCTAVO SYSTEMS LLC, Sugar Land, TX (US)

( * ) Notice: Subject to any disclaimer, the term of this patent is extended or adjusted under 35 U.S.C. 154(b) by 22 days.

(21) Appl. No.: 15/757,042

(22) PCT Filed: Sep. 2, 2016

(86) PCT No.: PCT/US2016/050157
§ 371 (c)(1),
(2) Date: Mar. 2, 2018

(87) PCT Pub. No.: WO2017/040967
PCT Pub. Date: Mar. 9, 2017

(65) Prior Publication Data
US 2019/0074268 A1   Mar. 7, 2019

Related U.S. Application Data

(60) Provisional application No. 62/214,640, filed on Sep. 4, 2015.

(51) Int. Cl.
*H01L 25/10* (2006.01)
*H01L 21/50* (2006.01)
(Continued)

(52) U.S. Cl.
CPC ............ *H01L 25/105* (2013.01); *H01L 21/50* (2013.01); *H01L 23/3128* (2013.01);
(Continued)

(58) Field of Classification Search
CPC ....... H01L 25/16; H01L 25/105; H01L 25/50; H01L 23/13; H01L 23/5384;
(Continued)

(56) References Cited

U.S. PATENT DOCUMENTS

| 4,667,403 A | 5/1987 | Edinger |
| 5,303,122 A | 4/1994 | Adams, Jr. et al. |

(Continued)

FOREIGN PATENT DOCUMENTS

| CN | 106575652 A | 4/2017 |
| EP | 1926138 A1 | 5/2008 |

(Continued)

OTHER PUBLICATIONS

Office Action issued for U.S. Appl. No. 15/968,171 dated Feb. 8, 2019, 14 pages.
(Continued)

*Primary Examiner* — Tuan T Dinh
(74) *Attorney, Agent, or Firm* — Rothwell, Figg, Ernst & Manbeck, P.C.

(57) ABSTRACT

Systems and devices for enabling the use of SIP subsystems to make a configurable system having a unique interconnecting scheme creates appropriate connections between the SIP components and/or subsystems such that desired characteristics and features for the configurable system are provided.

7 Claims, 21 Drawing Sheets

(51) Int. Cl.

| | |
|---|---|
| *H05K 1/02* | (2006.01) |
| *H01L 23/31* | (2006.01) |
| *H01L 23/367* | (2006.01) |
| *H01L 23/498* | (2006.01) |
| *H01L 23/538* | (2006.01) |
| *H01L 23/00* | (2006.01) |
| *H01L 25/16* | (2006.01) |
| *H01L 25/00* | (2006.01) |
| *H05K 1/14* | (2006.01) |
| *H05K 3/34* | (2006.01) |
| *H01L 23/36* | (2006.01) |
| *H03F 3/45* | (2006.01) |

(52) U.S. Cl.
CPC ...... *H01L 23/367* (2013.01); *H01L 23/49811* (2013.01); *H01L 23/5382* (2013.01); *H01L 23/5384* (2013.01); *H01L 23/5386* (2013.01); *H01L 24/48* (2013.01); *H01L 25/16* (2013.01); *H01L 25/50* (2013.01); *H05K 1/0286* (2013.01); *H01L 23/36* (2013.01); *H01L 23/3677* (2013.01); *H01L 2224/48091* (2013.01); *H01L 2224/48106* (2013.01); *H01L 2224/48227* (2013.01); *H01L 2224/48465* (2013.01); *H01L 2224/49171* (2013.01); *H01L 2225/1017* (2013.01); *H01L 2225/1023* (2013.01); *H01L 2225/1058* (2013.01); *H01L 2225/1094* (2013.01); *H01L 2924/00014* (2013.01); *H01L 2924/15311* (2013.01); *H01L 2924/16195* (2013.01); *H01L 2924/19105* (2013.01); *H03F 3/45071* (2013.01); *H03F 2200/231* (2013.01); *H03F 2200/396* (2013.01); *H03F 2203/45138* (2013.01); *H03F 2203/45206* (2013.01); *H05K 1/144* (2013.01); *H05K 3/3442* (2013.01); *H05K 2201/09381* (2013.01); *H05K 2201/10363* (2013.01); *H05K 2203/049* (2013.01)

(58) Field of Classification Search
CPC ..... H01L 23/3128; H01L 24/49; H01L 24/97; H05K 1/11; H05K 1/14; H05K 1/18; H05K 1/141–144; H05K 1/181–188
USPC .................. 361/760–790, 803; 257/686–777
See application file for complete search history.

(56) References Cited

U.S. PATENT DOCUMENTS

| | | | |
|---|---|---|---|
| 5,396,403 A | 3/1995 | Patel | |
| 5,683,788 A | 11/1997 | Dugan et al. | |
| 5,696,029 A | 12/1997 | Alvarez et al. | |
| 5,814,847 A | 9/1998 | Shihadeh et al. | |
| 6,054,767 A | 4/2000 | Chia et al. | |
| 6,133,626 A | 10/2000 | Hawke et al. | |
| 6,268,238 B1 | 7/2001 | Davidson et al. | |
| 7,060,535 B1 | 6/2006 | Sirinorakul et al. | |
| 7,259,467 B2* | 8/2007 | Inagawa | H01L 23/49838 257/784 |
| 8,065,576 B2 | 11/2011 | Miner et al. | |
| 8,399,973 B2* | 3/2013 | Oh | G11C 5/06 257/686 |
| 9,106,229 B1* | 8/2015 | Hutton | H01L 25/105 |
| 9,490,188 B2 | 11/2016 | Arvelo et al. | |
| 2001/0025993 A1 | 10/2001 | Inoue et al. | |
| 2002/0052054 A1 | 5/2002 | Akram et al. | |
| 2002/0170901 A1 | 11/2002 | Lau | |
| 2003/0110427 A1 | 6/2003 | Rajsuman et al. | |
| 2004/0229400 A1 | 11/2004 | Chua et al. | |
| 2005/0104198 A1* | 5/2005 | Takahashi | H01L 24/97 257/708 |
| 2006/0091523 A1* | 5/2006 | Shimanuki | H01L 24/97 257/698 |
| 2007/0280012 A1* | 12/2007 | Obayashi | G11C 29/027 365/200 |
| 2008/0029868 A1 | 2/2008 | Lee et al. | |
| 2008/0136011 A1* | 6/2008 | Shibata | H01L 23/13 257/691 |
| 2008/0205016 A1* | 8/2008 | Takatori | H01L 25/0652 361/792 |
| 2008/0288908 A1 | 11/2008 | Hart et al. | |
| 2008/0290486 A1 | 11/2008 | Chen et al. | |
| 2009/0278245 A1 | 11/2009 | Bonifield et al. | |
| 2010/0052135 A1 | 3/2010 | Shim et al. | |
| 2010/0134133 A1 | 6/2010 | Pagani | |
| 2011/0213921 A1* | 9/2011 | Yu | G06F 3/0688 711/103 |
| 2011/0233753 A1 | 9/2011 | Camacho et al. | |
| 2012/0241984 A9 | 9/2012 | Pendse | |
| 2014/0061643 A1* | 3/2014 | Kaeriyama | H01L 24/49 257/48 |
| 2015/0130040 A1 | 5/2015 | Defretin et al. | |
| 2015/0143588 A1 | 5/2015 | Sastry-Dent et al. | |
| 2015/0171066 A1* | 6/2015 | Yamamichi | H01L 24/97 257/411 |
| 2015/0243588 A1* | 8/2015 | Edwards | H01L 23/49503 257/670 |
| 2016/0216731 A1 | 7/2016 | Goh et al. | |
| 2017/0077072 A1 | 3/2017 | Yap | |
| 2017/0213885 A1 | 7/2017 | Wu | |
| 2017/0302224 A1 | 10/2017 | Frenette et al. | |

FOREIGN PATENT DOCUMENTS

| | | |
|---|---|---|
| WO | 9852226 A1 | 11/1998 |
| WO | 2006/076381 A2 | 7/2006 |
| WO | 2016/025693 A1 | 2/2016 |
| WO | 2016025693 A1 | 2/2016 |

OTHER PUBLICATIONS

International Search Report and Written Opinion issued in Application No. PCT/US2015/045022, dated Nov. 4, 2015, 14 pages.
International Search Report and Written Opinion issued in Application No. PCT/US17/015728, dated Jun. 6, 2017, 16 pages.
International Search Report and Written Opinion issued in Application No. PCT/US17/49611, dated Dec. 27, 2017, 17 pages.
International Search Report and Written Opinion issued in Application No. PCT/US17/052014, dated Dec. 4, 2017, 15 pages.
International Search Report and Written Opinion issued in Application No. PCT/US18/16171, dated Apr. 25, 2018, 12 pages.
C.R. Schlottmann, "Analog Signal Processing on a Reconfigurable Platform", Master's Thesis, School of Electrical and Computer Engineering, Georgia Institute of Technology, Aug. 2009, 72 pages.
J. McEleney, et al., "Multisite Test Strategy For SIP Mobile Technologies", Jul. 2006, 6 pages.
R. Normann, "First High-Temperature Electronics Products Survey 2005", Sandia Report, Apr. 2006, 44 pages.
S. Bernard, et al., "Testing System-In Package Wirelessly", IEEE, DTIS'06: Design and Test of Integrated Systems in Nanoscale Technology, Sep. 2006, Tunis (Tunisia), pp. 222-226, http://hal-lirmm.ccsd.cnrs.fr/lirmm-00094916, Sep. 15, 2006.
D. Appello, et al., "System-in-Package Testing: Problems and Solutions", IEEE, May-Jun. 2006, 4 pages.
Z. Noun, et al., "Wireless Approach for SIP and SOC Testing", Micro and nanotechnologies/Microelectronics, Université Montpellier II—Sciences et Techniques du Languedoc, 2010, English, https://tel.archives-ouvertes.fr/tel-00512832, Aug. 31, 2010, 66 pages.
P. O'Neill, "Choosing the Right Strategy for SIP Testing", EE Times, Connecting the Global Electronics Community, May 10, 2004, 2 pages.
M., Quirk, et al., "Semiconductor Manufacturing Technology", IC Fabrication Process Overview, Chapter 9, Oct. 2001, 41 pages.
J. Watson, et al., "High-Temperature Electronics Pose Design and Reliability Challenges", Analog Dialogue 46-04, Apr. 2012, 7 pages.

(56) References Cited

OTHER PUBLICATIONS

S. Benjaafar, et al., "Batch Sizing Models for Flexible Manufacturing Cells", Submitted to International Journal of Production Research, Department of Mechanical Engineering, University of Minnesota, 1995, 43 pages.
C. T. Sorenson, "Semiconductor Manufacturing Technology: Semiconductor Manufacturing Processes", NSF/SRC Engineering Research Center for Environmentally Benign Semiconductor Manufacturing, Arizona Board of Regents for The University of Arizona, 1999, 34 pages.
"Downhole Solutions", Motion Control Solutions Tailored to Your Critical Downhole Applications, What Moves Your World, MOOG, May 2013, 8 pages.
A. Weintraub, "Is Mass Customization the Future of Retail?", https://www.entrepreneur.com/article/229869, Nov. 14, 2013, 5 pages.
Hashimoto et al., "A System-in-Package (SiP) With Mounted Input Capacitors for Reduced Parasitic Inductances in a Voltage Regulator," 2010, IEEE, 25(3), pp. 731-740.
Office Action issued for U.S. Appl. No. 15/503,932 dated Jan. 5, 2018, 20 pages.
Final Office Action issued for U.S. Appl. No. 15/503,932 dated Aug. 2, 2018, 9 pages.
Search Report and Written Opinion issued for International Application No. PCT/US2016/050157 dated Jan. 17, 2017, 13 pages.
Office Action issued for U.S. Appl. No. 15/968,184 dated Nov. 15, 2018, 25 pages.
Search Report issued for European Patent Application No. 16843089.0 dated Mar. 26, 2019, 9 pages.
Chinese Office Action issued for Chinese Patent Application No. 2020111202018320 dated Nov. 17, 2020, 8 pages.

\* cited by examiner

CONFIGURABLE SUBSTRATE AND SYSTEMS

CROSS REFERENCE TO RELATED APPLICATION

This application is a 35 U.S.C. 371 National Phase Entry Application from PCT/US2016/050157, filed Sep. 2, 2016, which claims the priority to U.S. provisional Application No. 62/214,640 filed on Sep. 4, 2015, the disclosures of which are incorporated herein by reference in their entirety.

TECHNICAL FIELD

This disclosure relates to a System-In-Package ("SIP") substrate and programmable systems made from electrical components using those substrates.

BACKGROUND

System-In-Package ("SIP") devices are currently used in the semiconductor industry to assemble multiple integrated circuits, other devices and passive components in one package. Similarly, System-on-a-Chip ("SoC") refers to a device also currently used in the semiconductor industry that incorporates different functional circuit blocks on a single monolithic block of silicon to form one system circuit. SIPs are attractive because they allow miniaturization of microelectronic systems from a printed circuit board tens of square cm in size to a single package, typically approximately 5 square cm or less. SIPs enable integration of devices with diverse device fabrication technologies such as digital, analog, memories and other devices and components such as discrete circuits, devices, sensors, power management and other SIPs that are otherwise impossible or impractical to integrate in a single silicon circuit like an ASIC or SoC. These other discrete circuits used in a SIP may include non-silicon based circuits.

A co-pending application, PCT/US2015/045022, which was filed Aug. 13, 2015, and is titled Improved Substrate for System In Package (SIP) Devices, is directed to a new, simplified SIP design.

Another benefit of a SIP is that it allows building prototypes to test a system prior to further integration of some or all of the components into a single monolithic silicon circuit to produce a SoC. Conventional SIPs, also sometimes known as Multi-Chip Modules (MCMs) may use a common substrate or lead frame for assembly of multiple IC chips, but each new conventional SIP system requires a unique custom substrate. Such custom substrates typically involve a unique design, extensive engineering, and extensive manufacturing setup costs, thus incurring high costs and longer cycle times. These can be significant barriers where low costs and rapid prototyping are essential. Moreover, these additional costs and longer cycle times also may prevent development of low volume systems that could otherwise take advantage of the value of using a SIP for integration of multiple chips into a system. Accordingly, there is an unmet need for programmable SIP substrates/PCBs for use in a system.

SUMMARY

According to some embodiments, the use of multiple, different families of SIPs as subsystems is described to create a system using those families, as required to provide the desired functionality for a given system. In certain aspects, the present disclosures provide a configurable system, having a plurality of SIP subsystems, with each subsystem having predetermined functions, with means for connecting the plurality of SIP subsystems together to predetermine the desired overall characteristics and features of the configurable system based on the functions of each subsystem. These systems may be particularly adapted for use in harsh environmental conditions, which may include high pressure and high temperature applications for one or more of downhole oil and gas applications, automotive applications, aerospace applications, chemical and refining process plant applications, and power generation applications.

According to some embodiments, a configurable system is provided, which includes a plurality of electrical components and a substrate comprising an interconnection matrix having one or more connection pads. One or more of the components may be a SIP subsystem having predetermined functions. The interconnection matrix is arranged to provide re-configurable connections between two or more of the plurality electrical components, for instance, between two SIP subsystems. The configurable system may also include a plurality of wires, where at least one of the plurality of wires interconnects two or more connection pads of the interconnection matrix to determine the overall characteristics and features of the system According to some embodiments, a system is provided having a first SIP subsystem and a second SIP subsystem, where at least one of the first and second subsystems includes a substrate that has an interconnection matrix that is arranged to provide configurable connections between two or more components of said subsystem. The first and second subsystems can be arranged in a stacked configuration. In certain aspects, the first and second subsystems may be connected by a ball-grid array, which provides both electrical connectivity between the two subsystems and mechanical support.

According to some embodiments, a method is provided for configuring a system, which may include the step of placing preselected components on the substrate of one or more of a plurality of SIP subsystems, with each SIP subsystem preselected from a family of SIP subsystems with each member of the family using a common subsystem substrate having at least one interconnection matrix and having predetermined functions depending on which preselected components are placed thereon and the interconnections between the components. The method may further include placing the plurality of SIP subsystems on a system substrate having at least one interconnection matrix. The method further includes interconnecting the SIP subsystems independently of each subsystem, for instance, using an interconnection matrix to define the desired overall characteristics of the system. The method may further include applying a high temperature plastic packaging material, where the packaging material is configured for use in high pressure and high temperature applications, including one or more of downhole oil and gas applications, automotive applications, aerospace applications, chemical and refining process plant applications, and power generation applications. According to some embodiments, the method may include connecting the subsystems directly and without the use of an additional system substrate.

According to some embodiments, a standard substrate may be used for a family of SIPs, and includes a surface layer having multiple component pad positions for placing components thereon, multiple components positioned on the surface layer, and an interconnection matrix disposed on the layer for providing programmable interconnections between the components. In certain aspects, a standard substrate for use in a family of SIPs, includes a conductive surface layer having multiple component pad positions for placing components thereon, at least one conductive layer spaced apart from the surface layer, fixed interconnections between preselected portions of each layer to preselected portions of said other layer, the component pad positions on the surface layer having preselected fixed interconnections, and an interconnection matrix disposed on the surface layer with fixed interconnections.

According to some embodiments, a landing pad assembly for use on a substrate is provided. The assembly includes two spaced apart individual conductive areas for making interconnections with a component, with each conductive area having a plurality of contiguous connected physical portions of varying size to accommodate components of different sizes.

According to some embodiments, a fault tolerant system is provided. The system includes a first SIP subsystem and a second SIP subsystem, where the first and second subsystems include multiple, duplicate, parallel circuits that operate concurrently and generate duplicative output signals. The fault tolerant system also includes a controller, such as a circuit or microprocessor, that compares the output signals and selects for use the output signal of one of the subsystems and/or circuits. The controller may be further configured to switch to an alternative output signal associated with a different one of said subsystems and/or circuits when the originally selected signal is anomalous, or otherwise indicates an error, such that the fault tolerant system continues to operate in a fashion that is normal for the fault tolerant system. In this respect, embodiments may provide redundancy that enables a self-healing system that detects a failure using the substrates and subsystems of the present disclosure. In some embodiments, the controller may also be a SIP.

According to certain embodiments, a substrate is provided that includes a surface layer having multiple component positions each having lead finger pads associated therewith and located thereon and having multiple component positions each having a surface mount device (SMD) pads associated therewith and located thereon. The substrate also includes at least one conductive layer spaced in an insulating manner from said surface layer and having conductive portions fixedly interconnected with portions of the lead finger pad positions and the SMD pads, as well as an interconnection matrix having bond pads on the surface having fixed interconnections with the at least one conductive layer for individual fixed connections to at least a portion of the individual component lead finger pads and each of the SMD pads. The matrix is suitable for making programmable interconnections between selected component lead finger pads and SMD pads.

These and other features of the invention will become apparent to those skilled in the art from the following detailed description of the invention, taken together with the accompanying drawings.

DETAILED DESCRIPTION

Figure 1:
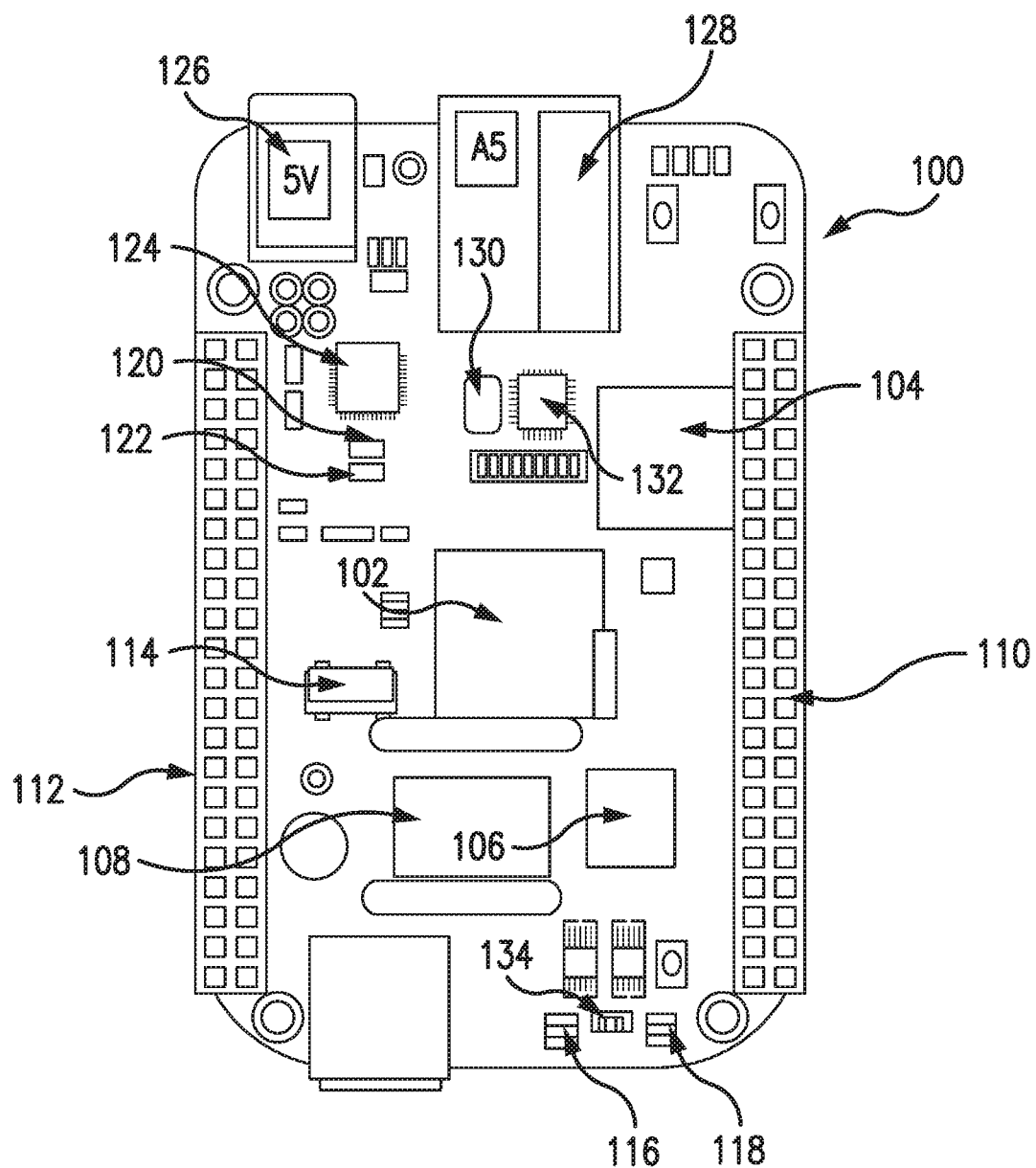
FIG. 1 is a diagram showing a prior art system having various components.

Referring now to FIG. 1, the figure shows a general purpose Printed Circuit Board ("PCB") 100 for a representative system with individual packaged components 102, 104, 106, 108, 114, 124, 126, 128, 130, 132 assembled on it. Although other components are depicted, not all are labelled. Some components may be major active components 102-108, 114, 124, 130, 132, while some may be passive components 116, 118, 120, 122, 134. Elements 110, 112 are sockets for daughter boards. Such a prior art system board is typically 86 by 54 mm. As is known in the semiconductor art, the various components are interconnected by metal layers embedded in the PCB to form a representative system.

Figure 2:
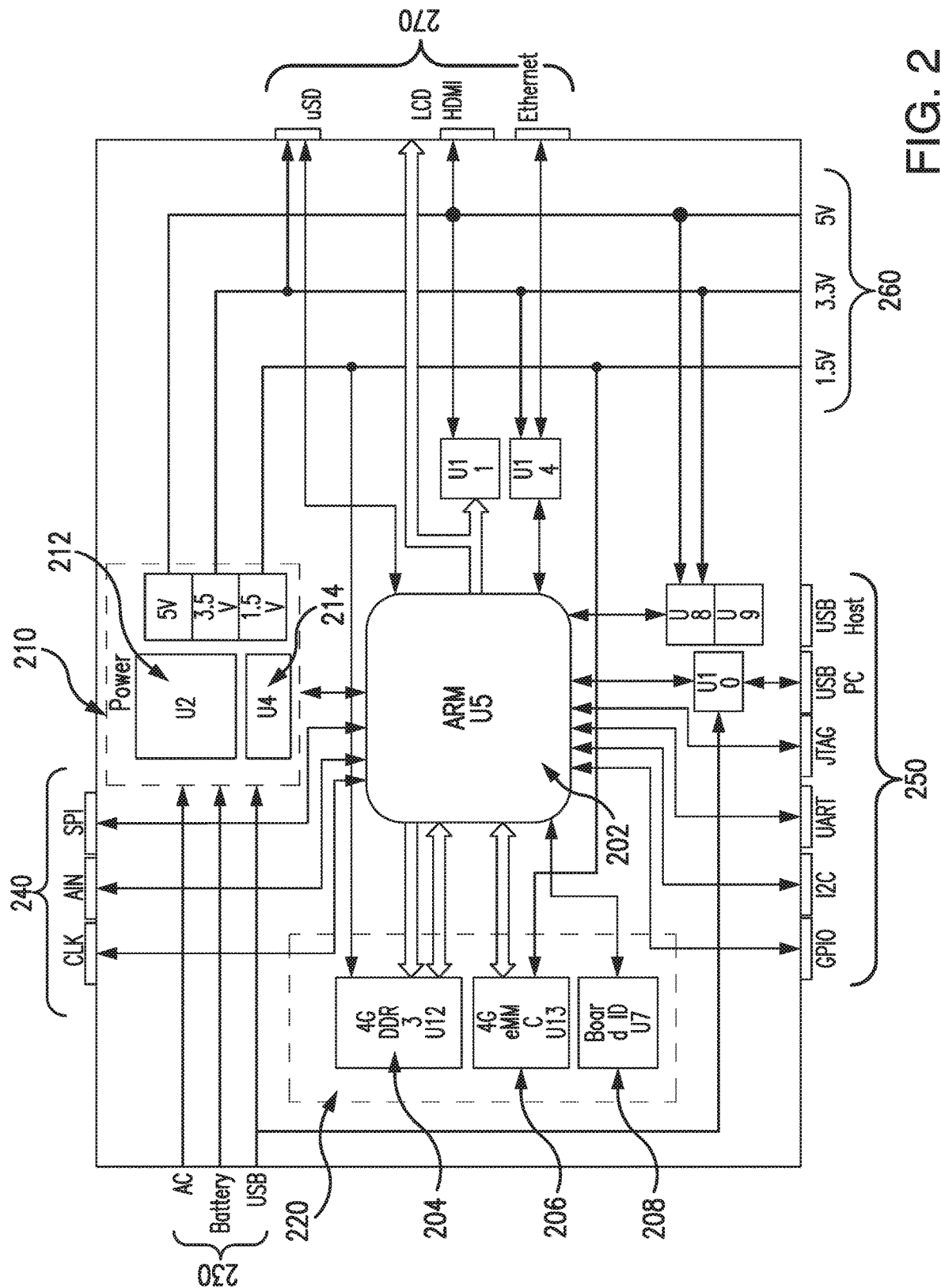
FIG. 2 is a diagram showing a prior art system having various components.

Referring now to FIG. 2, the figure shows a block diagram 200 for a system that is similar to the system in FIG. 1, and is a board level system. The system may be understood as a microprocessor 202-based system with the necessary major supporting components around it to make the system functional. Those components include sections for memory 220 and power management 210. For example, the memory section 220 includes DDR memory 204, eMMC (flash) memory 206, and board flash memory 208. Similarly, the power management section 210 includes a power management integrated circuit (PMIC) 212 and a low voltage dropout (LDO) circuit 214. The system also has external connections for power 230, clocks 240, outputs 260 and 270, and input/outputs 250. Some portions of the individual external connections in the diagram are not labelled or discussed other than collectively as a group.

Figure 3:
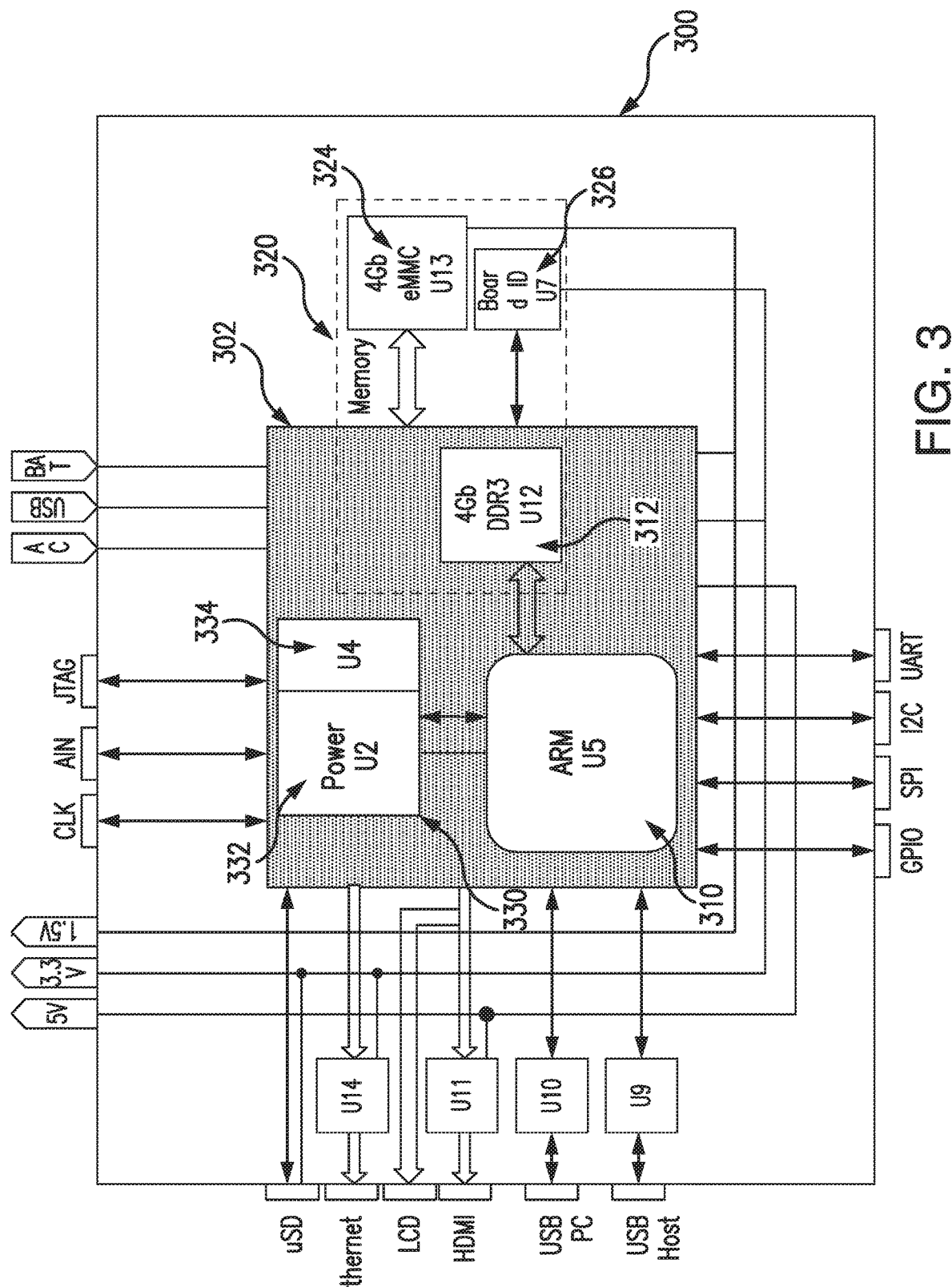
FIG. 3 is a diagram showing a SIP system having various components.

Referring now to FIG. 3, the block diagram 200 of FIG. 2 has been re-drawn as block diagram 300 with a portion 302 containing components designed to be included in a SIP, with the SIP containing those components contained within the outlined portion 302 of FIG. 3. The SIP portion 302, shown with a gray background, includes at least three major components from FIG. 2. Those components are the microprocessor 310, memory (DDR) 312 and power management 330. With these major components integrated into a SIP, the rest of the system 100 of FIG. 1 can be designed as a smaller sized and lower cost system. Again, the memory section 320 includes DDR memory 312, but the other memory components may be located on the system board rather than in the SIP portion 302. Thus, the eMMC flash memory 324, and board flash memory 326 are preferably on the system board. The power management section 330 includes both the PMIC 332 and LDO 334.

Figure 4:
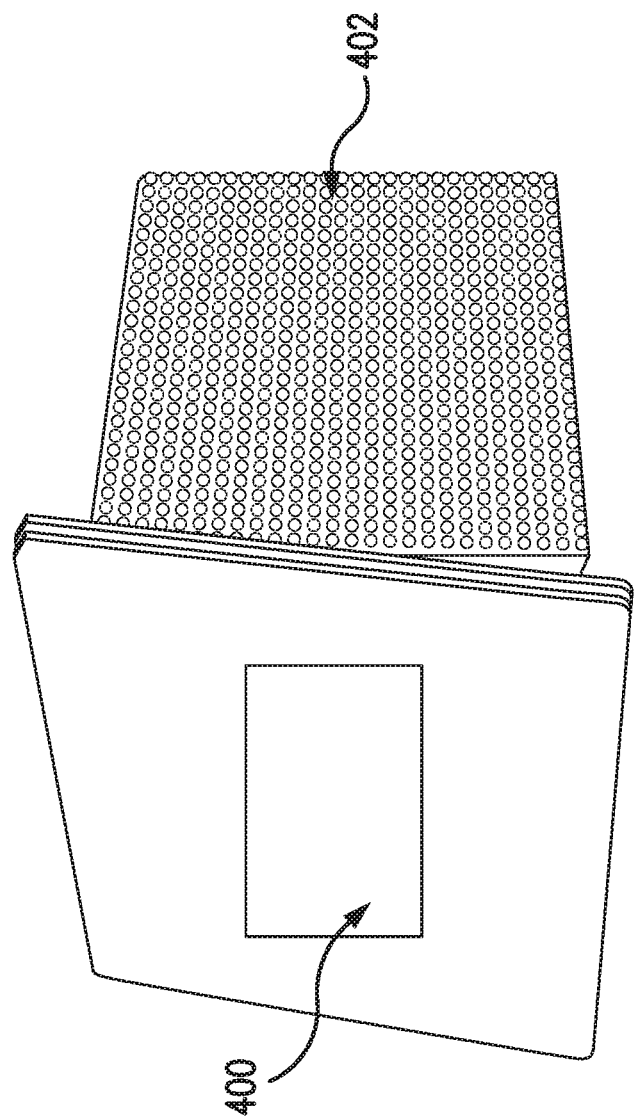
FIG. 4 is a diagram showing a packaged SIP.

Referring now to FIG. 4, there may be seen a packaged SIP 400 containing those components within portion 302 of FIG. 3, and using a ball-grid array 402 for external connections. Since the die size of components is typically much smaller than the individual packaged components 102-108, 114, 124, 130, 132 mounted on the PCB 100 of FIG. 1, the resulting SIP size is much smaller. The advantages of the SIP include its savings of space, reduced power, improved performance and the ability to use devices made with different technologies. For example, aspects of the present disclosure may translate a portion of the PCB based system like that of FIG. 1 into a SIP-based system. This reduces the size of the system implementation to ¼ to ¹⁄₁₀ the size and accordingly reduces the cost of the system (it also may reduce the number layers in the PCB). However, each SIP substrate (e.g. the PCB) is typically custom tooled and patterned with unique routing lines because each system has its own unique net list for making the interconnections between the various components located on the PCB. This uniqueness of each design results in higher design, tooling and qualification costs and longer lead times to fabricate samples.

Figure 5A:
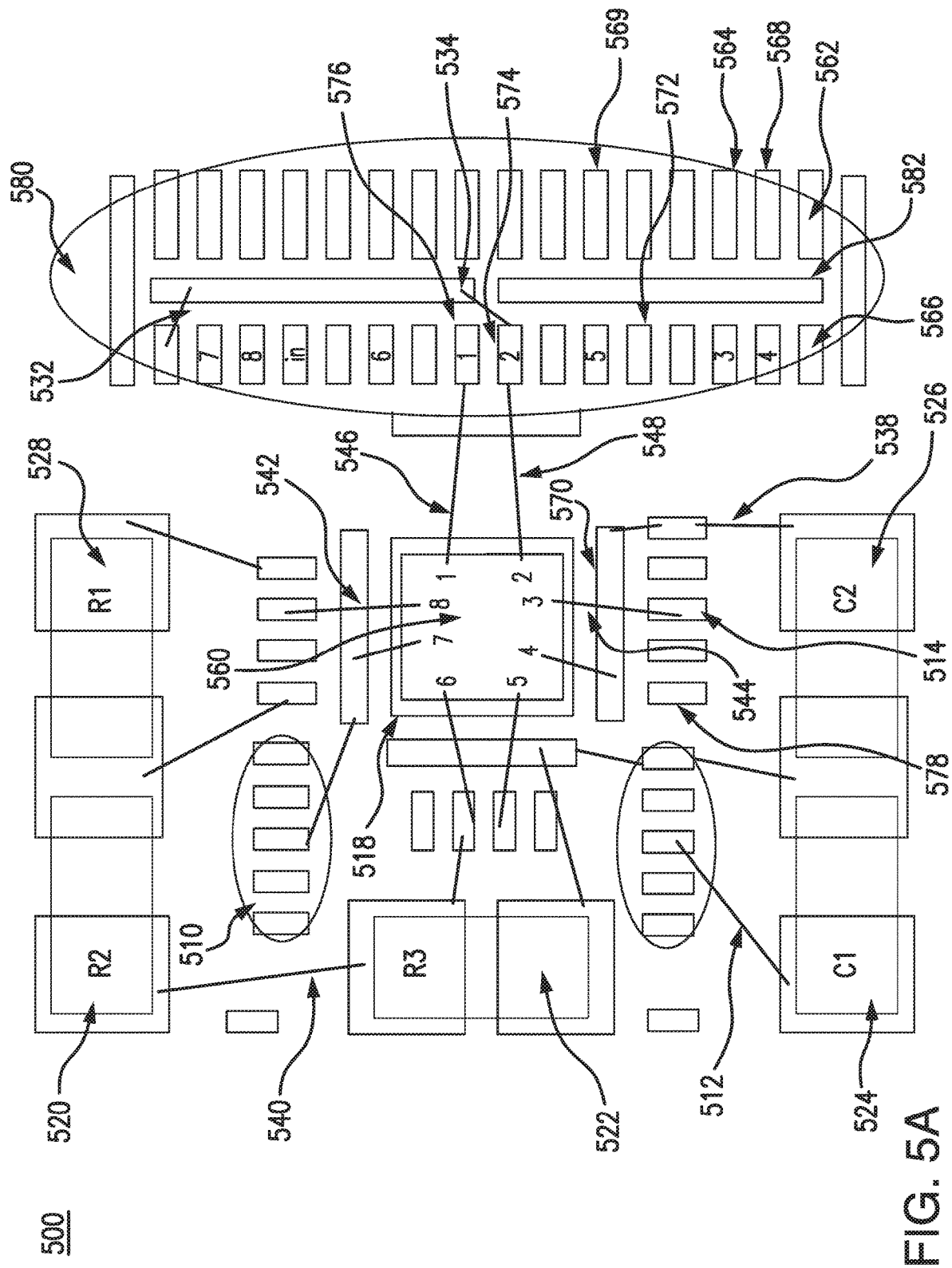
FIG. 5A and FIG. 5B are diagrams showing the physical layout of a system in accordance with exemplary embodiments.
Figure 5B:
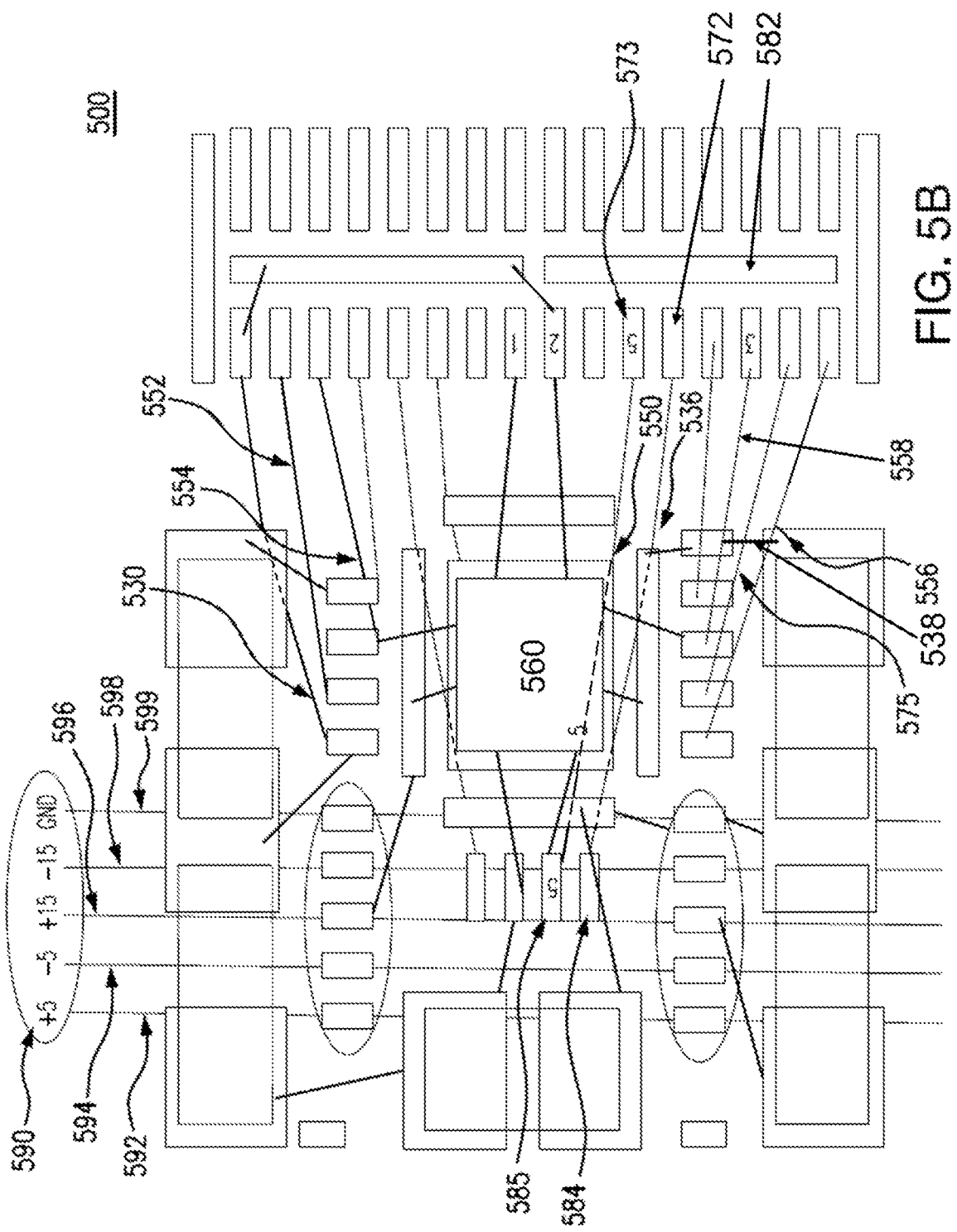

Referring now to FIGS. 5A and 5B, the figures show a portion of a physical layout 500 on a substrate for a system in accordance with certain embodiments. The layout may be, for instance, an electrical circuit for multiple electrical components, including an active component for a system such as, for example, but not limited to, an operational amplifier. The active component may be, in certain embodiments, an SIP. The layout 500 may illustrate different layers of the arrangement in FIGS. 5A and 5B. The layout 500 includes an interconnection matrix 580 and die pad 518. In some instances, passive circuit elements like resistors 520 (R2), 522 (R3), and 528 (R1), capacitors 524 (C1), 526 (C2), and inductors (not shown) may be directly connected to an active component, while in other cases the matrix 580 may be used to make these interconnections.

In the embodiment of FIG. 5A, the passive circuit elements are placed near the active component 560 (e.g., an operational amplifier) that are located on the surface (or signal) layer so that direct connections may be made, if desired, or needed for a particular system function. In certain aspects, active component 560 may be a SIP. The passive circuit elements are mounted on and connected to surface mount device pads (SMD pads, or landing pads such as those depicted in FIG. 7) also located on the surface layer. Alternatively, the passive circuit elements may not be located near the active devices and therefore the matrix 580 will become the location where most of the interconnections will occur using a predetermined bond wire pattern between representative pads 562, 564, 566, 568, 569, 572, 574, 576, in the matrix 580, all of which may be located on the surface layer. The active component's die 560 may also have direct connections 542 (pin 8), 544 (pin 3) between the die lead finger pads and the die wire bond pads (not labeled). Additionally, the active component 560 may also have direct connections 546 (pin 1), 548 (pin 2), to the pads of the interconnection matrix 580. Pad 514 is an example of a lead finger pad located around the die pad 518 for the active component 560 to make connections between the die 560 and the rest of the system, which may be via the interconnection matrix 580, or alternatively through other wire bond connections connected to this pad 514 and then to another component's pad(s) located on the surface layer.

According to certain embodiments, a substrate (e.g., formed as a PCB) may have multiple spaced apart conductive layers which may be etched or otherwise created to provide conductors in specific patterns of unique conductive routing lines or configurations within each conductive layer and vias for interconnections between layers and pads ("circuitization"). These patterns may be used to interconnect the different components on the substrate which may include, but are not limited to, semiconductor devices, passive electrical components, and other devices. According to certain embodiments, for a SIP, the circuitization in the substrate connects components to the pads of the interconnection matrix allowing for different interconnectivity schemes using bond wire patterns that depend on the components located on the substrate and the desired functionality and features of the system that the substrate is intended to provide, once all the components are completely connected. In certain aspects, the substrate/PCB may also be constructed in a flexible manner in the form of a multi-layered film or tape having fixed, predetermined ("hard-wired") conductive patterns of conductive routing lines and vias for making electrical interconnections in and between each layer. That is, these conductive patterns can make "hard-wired" interconnections between the components as also described herein. These patterns may interconnect with components using vias connected to a portion of the pattern and to a pad associated with a component. In addition, some portions of an interconnection matrix, such as matrix 580, may be hard-wired using portions of these same conductive patterns. In this instance, the remaining needed connections may be completed using the interconnection matrix 580 with a predetermined pattern of bond wires between pads, such as those of 562, 564, 566, 568 to form a desired system.

With reference to FIG. 5B, power rails 592, 594, 596, 598, 599, (collectively 590) may, in certain aspects, be in a conductive layer (power plane) that is separate from any conductive layer such as that depicted in FIG. 5A and used to contain and route signals. These power rails 592, 594, 596, 598, 599, may be below the surface (signal) layer and connect to their pads 510 on the surface layer using vias, for instance, as depicted in and described with reference to FIG. 8. The matrix for distribution of power may also be distributed rather than being restricted to one area or type of arrangement or configuration, like the interconnection matrix for the signals. In some embodiments, the matrix 580 is preferably on the conductive signal layer (e.g., signal layer), and the power plane is routed in one or more conductive layers under the signal layer of the active components 560, so that the system using the active component 560 can easily be powered without interfering with the signal interconnections. It is also possible for any passive circuit elements (such as those needed to act as bypass capacitors) to be located near the active component die location. In this example, the power rails have pads 510 (FIG. 5A) located on the signal layer by use of vias and the die pad 518 has a set of rectangular pads 570, 571, around it that are a power ring 570 that allow for easy power connections between the active component 560 and the needed power rail voltage. According to certain aspects, bond pads 562, 564, 566, 568, (FIG. 5A) in the interconnection matrix 580 may be circular, square, rectangular, linear or any shape depending on surface space on the signal layer available for their use and the need for any interconnections (circuitizations) to one or more of the conductive layers below the surface layer. Pad 582 is one example of a vertical pad in matrix 580. One example of the circuitization is the fixed interconnection 536 (FIG. 5B) between a lead finger pad 584 for die pad 518 (FIG. 5A) to a pad 572 in the interconnection matrix 580 (FIG. 5A). Similarly, there may be a fixed interconnection 550 (FIG. 5B), which is part of the circuitization between matrix pad 573 and die 560, via lead finger pad 585 for pin 5 of die 560. These connections may be illustrative of how a component may be electrically connected to other components using the pads of the matrix 580, rather than using direct wire bond connections (like 538). These illustrative interconnections can be made through a conductive layer pattern between the vias associated with each pair of the two respective pads. Additional representative fixed or hardwired interconnections 530, 552, 554, 575 are depicted in FIG. 5B for illustrative purposes.

According to some embodiments, FIG. 5A shows a configurable interconnection matrix 580 and that depicts die pad 518 and lead finger pads 514 for die 560, and where bond wires or wire bonds are used to complete selected interconnections using the array of pads in matrix 580. The starting point for the substrate or PCB may use etched conductive layers and vias for fixed or hard-wired connections, which only partially completes the required system connections, which remaining connections are provided by interconnections like those of 536, 550, 556, 558, depicted in FIG. 5B.

Further referring to FIG. 5A, in some aspects an array of wire bond pads 580 may be fabricated on the surface of a substrate (or PCB) at a central location, or at any other desired location, with each bond pad in the array 580 separately interconnected to a one or more unique individual lead finger pad(s) 514, 584, 578, for die 560, or landing pads for passive circuit elements. There may also be bond wires 532, 534 for interconnections between the pads (like 574) in matrix 580. In addition, there may be bond pads included in the array 580 that are not connected to anything that serve as jumper connectors (or dummy pads) for making longer wire connections. In this example, any desired or preselected interconnections may be completed by wire bonding using a predetermined wire bond pattern on the pads of array 580, including any needed dummy jumper pads. The array 580 of pads, in effect, transposes the pads from the chip/die locations to a central location, or any other convenient location, for ease in making wire bond connections that are preselected and changeable.

Multiple bond wire interconnections may be used for direct connections between a component, such as an operational amplifier, and other components (e.g., passives and/or power components) associated with that component. For instance, all of the signal bond pads for an active component and its passives may be brought out to, and interconnect with, the bond pads of the interconnection matrix. In certain embodiments, the bond pads for the interconnection matrix are preferably on the topmost signal layer of the substrate. In this manner, any desired interconnection scheme may be made using bond wires between the appropriate bond pads of the interconnection matrix. These bond wires may be installed as part of the final fabrication steps, and as such, the programming of the interconnection of the components for a desired system functionality may be deferred until the last fabrication steps. Thus, there may be direct connections between an active component and its associated passives, connections for any component to the pads of the interconnection matrix, and interconnections between one pad of the interconnection matrix and a second pad of the interconnection matrix.

Accordingly, one embodiment provides a substrate having a surface layer having multiple component positions each having bond pads associated therewith and located thereon and having multiple component positions each having a surface mount device position associated therewith and located thereon, at least one conductive layer spaced from said surface layer in an insulated manner and having conductive portions fixedly interconnected with portions of said component wire bond pad positions and said surface mount device positions pads, and an interconnection matrix having bond pads on said surface layer having fixed interconnections with said at least one conductive layer for one or more individual fixed connections to each of said individual component wire bond pads and each of said surface mount device position pads and suitable for making programmable interconnections between selected component wire bond pads and surface mount device positions pads.

In certain embodiments, a power pad may use a bond wire to connect to a power ring. As such, a power pad may be used to interconnect the power ring portion with its desired voltage supply from the power plane using vias to interconnect the pad with the appropriate voltage.

Figure 6:
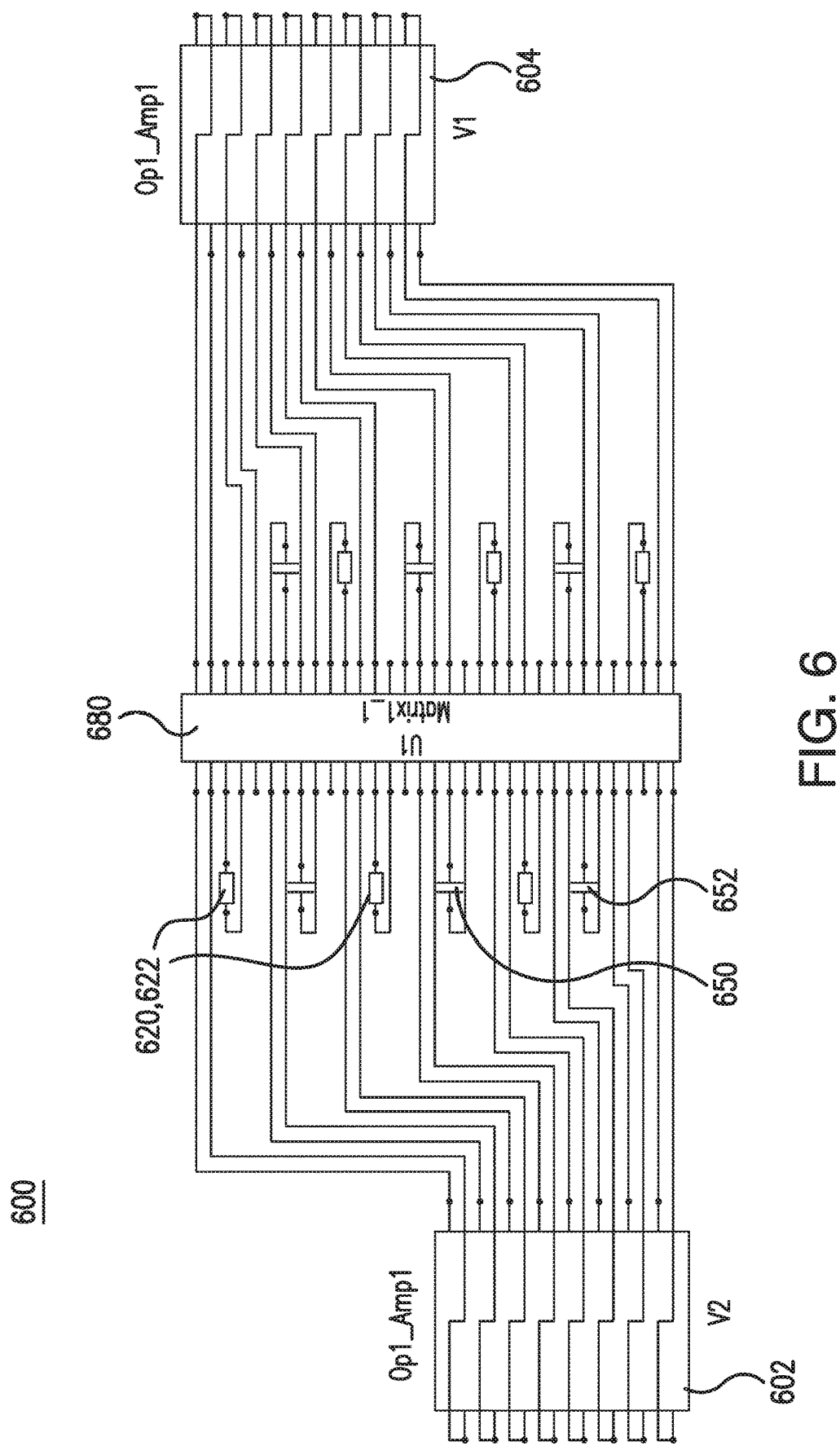
FIG. 6 is a circuit diagram of a system in accordance with exemplary embodiments.

According to certain embodiments, FIG. 6 is a schematic representation of a substrate 600 specifically for two active circuits 602, 604 (e.g., operational amplifiers) and the passive devices associated with each active component. In certain aspects, the active circuits 602,604 may be SIPs. In this schematic, each active circuit has ten passive devices which are associated with it. For example, die pad 602 has landing pads for representative resistors 620, 622, and landing pads for representative capacitors 650, 652. In accordance with certain embodiments, circuitizations represented by the various interconnection lines in FIG. 6 may be used to interconnect the pads of the components with the pads of the interconnection matrix 680, thus allowing for different interconnection schemes using the interconnection matrix by employing different bond wire patterns depending upon the system functionality desired. In this example, since all of the active and passive circuits are connected to the connection matrix, passive devices can be shared with other active devices. Additionally, each passive device, although shown in this example as either a resistor or capacitor, may be populated with any device requiring two connections, such as for example, but not limited to, resistors, capacitors, inductors, sensors, LEDs, etc. In the same manner, any die that can fit onto the die pad 602, 604 of the physical layout 600 can be used as long as there are enough lead finger pads associated with the die pad to handle the needs of the die and the system in which the die is employed. In this example, since there are no connections shown within the connection matrix 680, this embodiment has not yet been programmed (i.e., populated with wire bonds for any desired direct connections) in order to perform a desired function. Finally, not all of the locations for either the active or passive devise need to be populated. Only the ones necessary for the components of a specific design for a specified system need be populated.

Although layout 600 is depicted for two active devices and their supporting passive devices, it may be replicated any number of times on a substrate to provide the number of active devices required by a system or circuit. For example, a system may employ six such active devices, such that the layout 600 is replicated two more times for a total of three instances of this layout 600 on the substrate, again with all of the components, actives and passives, only being connected to the pads of the matrix. This type of substrate design allows for maximum flexibility of component placements and maximum flexibility of how those components are interconnected. The lines connecting the individual components, actives and passives, represent the circuitization that would be in the conductive etched lines in the conductive layer(s) (circuitization layer or layers) disposed in an insulating manner below the surface layer on which the pads and components would be placed.

Figure 7:
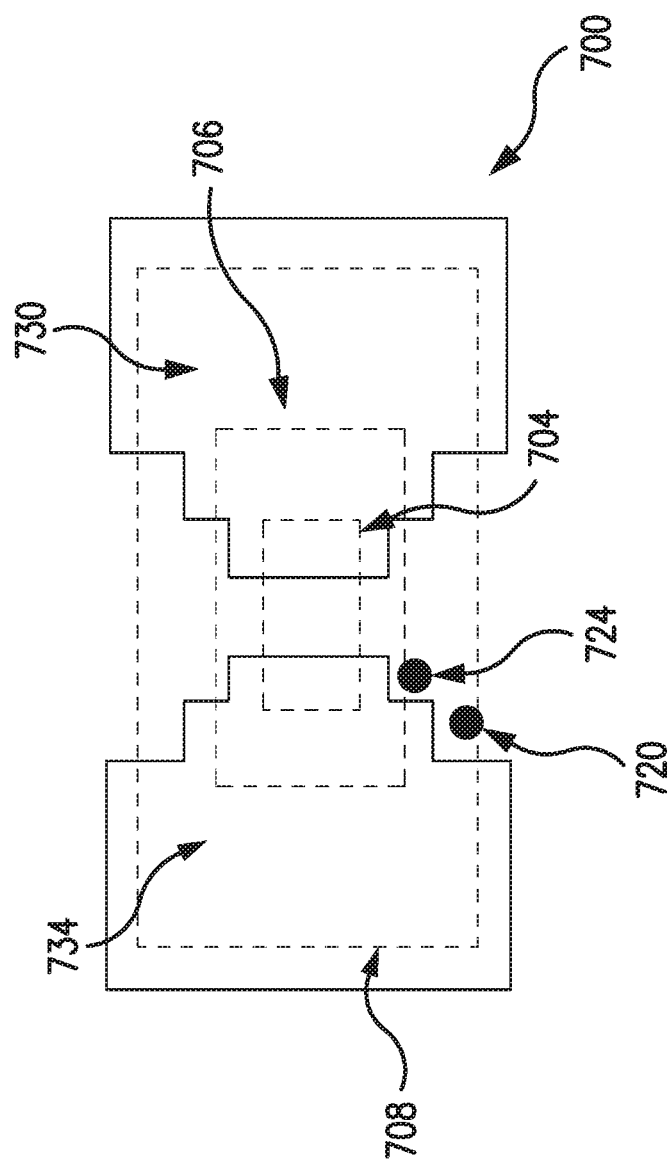
FIG. 7 is a diagram of a multi-sized pad for mounting components in accordance with exemplary embodiments.

Referring now to FIG. 7, according to some embodiments, multi-sized landing pads (or SMD pads) 700 are shown. Pads 700 may be used, for example, for mounting passive components, or any components that require two electrical connections to be operative, on a substrate for the same or equivalent components, but of differing physical sizes and ratings. The functions and environment in which the system using the substrate is expected to operate may determine the physical size of many components. In the example of FIG. 7, two vias 720, 724 are conveniently located near any component needing power or ground connections. The dashed lines 704, 706 and 708 depict three different physical sizes for a component available for use with a single landing pad (SMD pad) of the present disclosure. The component can connect into the substrate circuitry using the two pads 730 and 734 that are included as part of and make up the landing pad (or SMD pad) 700.

In certain aspects, the passives used for high temperature systems can be very large (typically 1.6 mm×3.2 mm) and very expensive (e.g., $700 each). However, when the temperature is in the, for example, 150 C or less range, a standard smaller passive can replace the larger high temperature passive. The lower temperature passives may be much smaller (typically 1.0 mm×0.5 mm) and much cheaper (e.g., $0.10 or less). A multi-sized (passive) landing pad (SMD pad) in accordance with disclosed embodiments allows the same substrate to accept multiple sizes of components. This allows for a cheaper implementation for lower temperature applications without having to re-layout the substrate for a system requiring use in both high temperature applications as well as non-high temperature applications. In the example of FIG. 7, the pads are set up to accept three different sizes of the same passive device. Two of the sizes for example might be 2.5 mm×1.25 mm and 1.0 mm×0.5 mm. A telescoped design allows for vias to be nested inside the overall geometry of the landing pad shape rather than on the outside of the pad geometry and spaced along the end, side or middle of the pad geometry. Allowing the nesting of vias provides more space to for use of conductive interconnections. The pads 730, 734, may also be square or round, rather than telescoped. Embodiments of the present disclosure allow for the use of a standard substrate for a family of subsystems that can accommodate components having different physical sizes and using the interconnections matrices or panels to program the desired functions for the subsystem using that substrate and its selected components.

Figure 8:
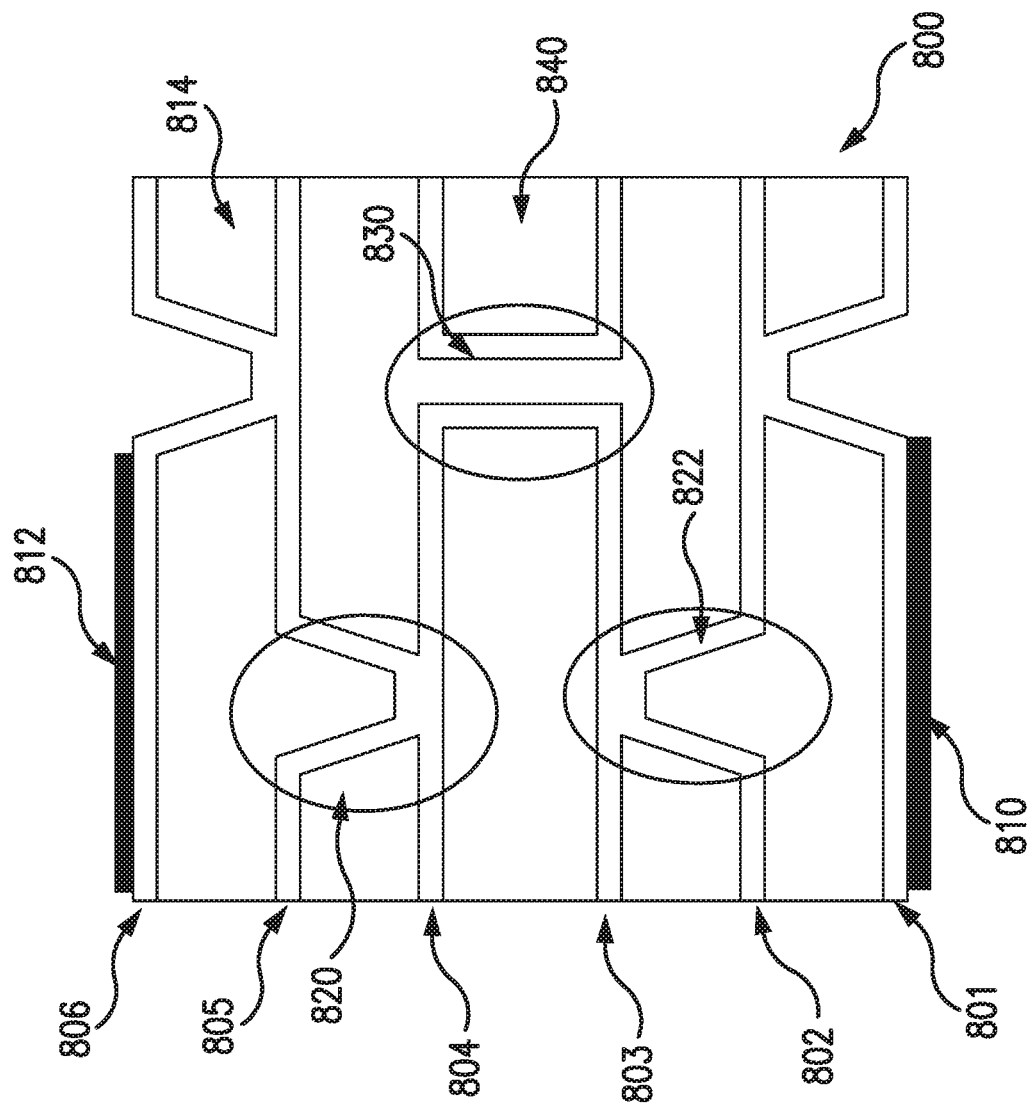
FIG. 8 is a cross section of a substrate in accordance with exemplary embodiments.

Referring now to FIG. 8, a cross section of a portion of a substrate according to certain embodiments is shown. It may have, for example, six conductive layers. The six conductive layers 801, 802, 803, 804, 805, 806 are spaced apart by nonconductive materials 814, which may be a nonconductive resin. In FIG. 8, the conductive layers may be preferably copper, but any conductive material may be used, and the nonconductive materials are preferably resin, but any nonconductive material may be used. A structural base layer 840 and others may be added above and below a base layer, and may be thinner than the base layer. Similarly, multiple vias 820, 822, 830 are depicted and can be located in the signal layer or other layers in appropriate locations spaced on the plane of the layer needed to accomplish the required interconnections. In addition, solder layers 810 and 812 may be used.

Figure 9:
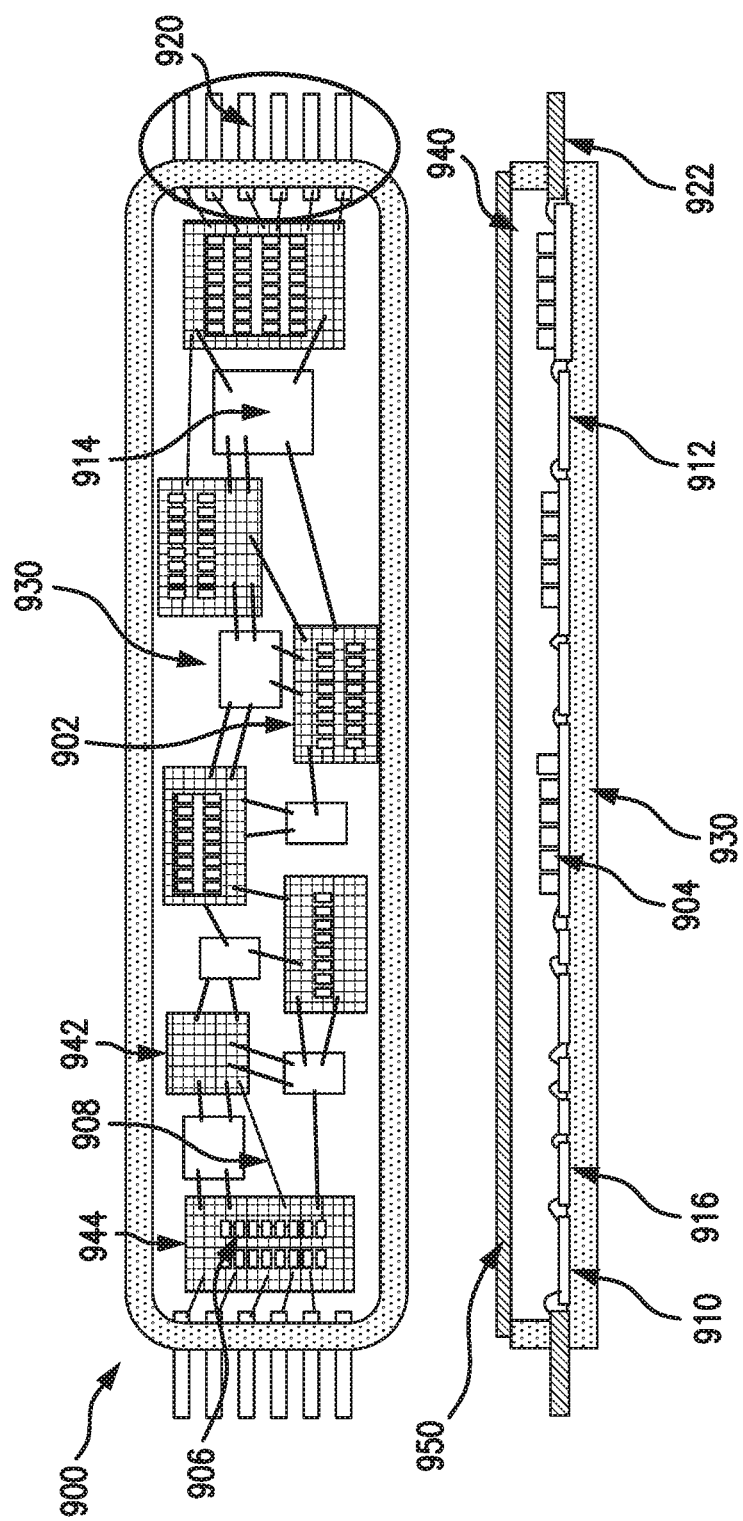
FIG. 9 is a diagram of a system in accordance with exemplary embodiments.

Referring now to FIG. 9, two views of a SIP 900 using an interconnection matrix are shown, in an overview and a cross-sectional side view. In this embodiment, the substrate 930 preferably has no circuitization. It is, for example, a blank ceramic or metal substrate, though other embodiments may employ multiple conductive layers and circuitizations. The interconnection between active devices 914 and passive components 904 is accomplished by a set of interconnection "thumbnail" matrix panels 902, 942, 944, which may have predetermined conductive patterns and form a matrix interconnection system. These panels may be small pieces of a PCB with the matrix pads and interconnections similar to those in other embodiments. In certain aspects, the panels may be on a much smaller scale, and can be attached to the substrate alongside other devices and passive components may be attached on the surface of these panels according to the specific requirement of the specific system. Each of the pre-circuitized "thumbnail" matrix panels 902, 942, 944 contains conductors on their surface, and when required, optionally in substrate layers below. These conductors can be further customized through bonding wires that can be bonded on the pre-existing arrays of pads, one example of which is pad 906. External leads 920 are also shown. A wire bond 908 interconnects two separate matrix pads, one in matrix 942 and one in matrix 944.

Further referring to FIG. 9, there may be seen a cross section of the SIP 900. Depicted are the top 950 of the package 900 containing the SIP and a cross section 922 of the leads 920. Also, 940 depicts the open area between the components and substrate and the top 950 of the package 900. Elements 912 and 916 are cross sections of an active device or component and 904 is a cross section of a passive device or component located on the surface of a matrix panel. Element 910 is a cross section of a panel 944, which may have passives on its surface. Element 930 may serve as both the package base and the substrate. According to certain aspects, the conductor pattern on the surface of each matrix panel (and in any conductive layers below the surface) 902, 942, 944 may be arranged such that their configuration can be changed to accommodate different devices. This customization ability is attained through wire bonding on the surface of a matrix panel between and within arrays of pads or terminals on the surface of each matrix panel which are amenable to different interconnecting schemes. Thus a single substrate can be used for multiple SIPs thereby reducing the time and expense of designing a new substrate.

According to some embodiments, the required system customization, which is defined by a system's unique preselected interconnecting scheme, is done during assembly by creating appropriate preselected links with wire bonds on the surface of each matrix panel that is strategically placed on the surface of the substrate and may be intentionally left open or not connected for purpose of being able to make multiple, different and unique customized wire bond link patterns depending upon the system components actually used in a system and that system's application(s). These wire bond links can be changed as required by a system's design just prior to final packaging. The matrix panels of the present invention may also have multiple conductive layers for interconnection of different portions of circuits on their surface, in addition to the bond wires on the surface, to handle the power rails and other common interconnections. This allows for changeable interconnections on the surface layer and fixed interconnections embedded in the substrate. For some implementations, the wire bond links may act as additional layers of the substrate, thus reducing the number of conductive layers within a substrate. The wire bond links provide the flexibility to reconfigure or reprogram the substrate and the associated components for a new system implementation but using the same components arranged in a different circuit configuration.

Figure 10:
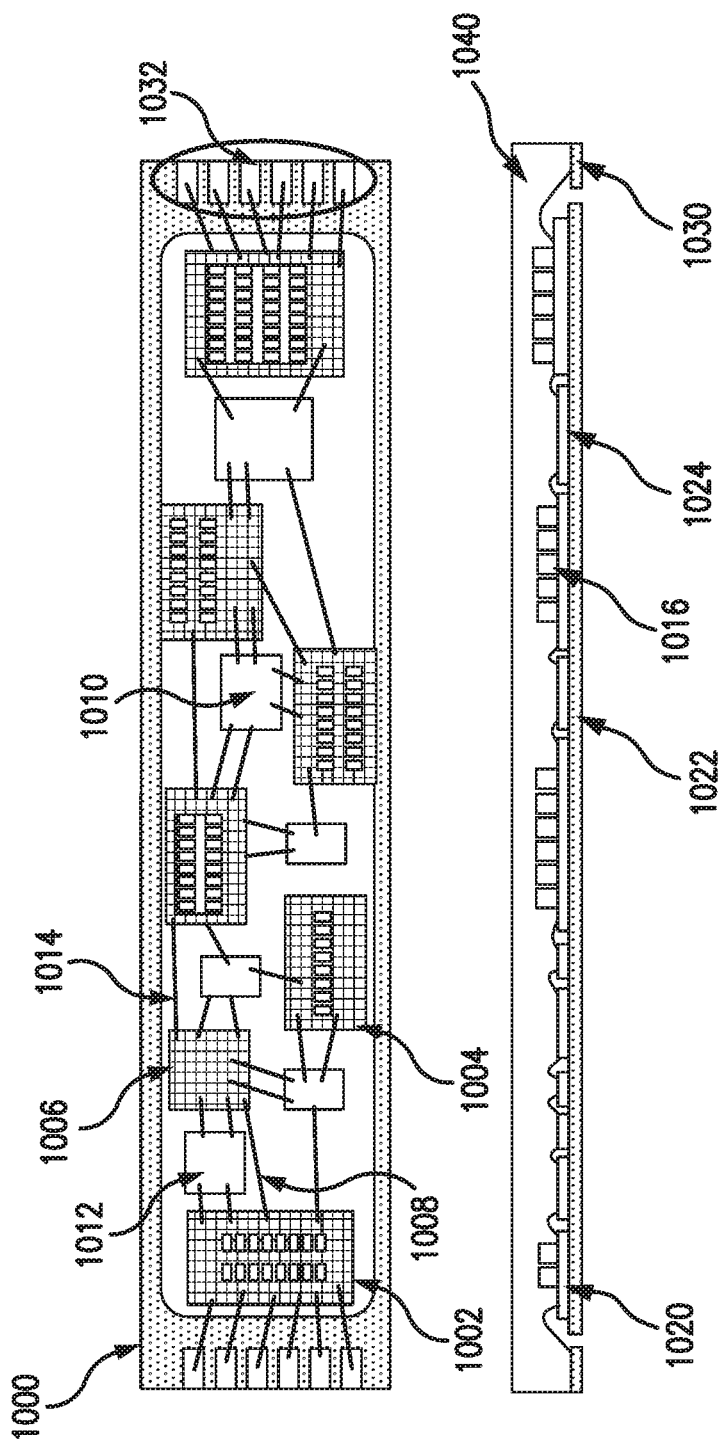
FIG. 10 is a diagram of a system in accordance with exemplary embodiments.

Referring now to FIG. 10, two views of a SIP 1000 are illustrated using matrix interconnections in an overview and a cross-sectional side view. In this embodiment, the components are embedded in plastic. Similar to the embodiment of FIG. 9, pre-circuitized "thumbnail" matrix panels 1002, 1004 1006, which contain the necessary circuitization to interconnect all the components to form a system are utilized. Further customization is accomplished by use of bonding wires connecting terminals or pads within or on the matrix panels and between a panel and semiconductor devices and components, and between two or more panels. The external connection is provided through a set of external lead connectors 1032. The SIP 1000 uses the interconnections matrix embodiments of the present disclosure, and in this embodiment, the substrate 1022 preferably has no circuitization. It is preferably a blank metal substrate, but other embodiments may employ multiple conductive layers and circuitization, or other materials that form a structural support for the SIP may be employed. The interconnection between active devices 1010, 1012 and passive components (not labelled) is accomplished by a set of matrix panels 1002, 1004, 1006, which may have predetermined conductive patterns and form a matrix interconnection system. These panels are effectively small pieces of a PCB with the matrix pads and interconnections similar to those in the earlier Figures, but on a much smaller scale, and can be attached to the substrate alongside other devices and passive components may be attached on the surface of these panels according to the specific requirement of the specific system. Each of the pre-circuitized "thumbnail" matrix panels 1002, 1004, 1006, may be provided as conductors on the surface, and when required, optionally in substrate layers below. These conductors can be further customized through bonding wires that can be bonded on the pre-existing arrays of pads on each matrix panel, e.g. using the pads (not depicted) on the surface of each matrix panel. A representative wire bond 1008 interconnects two separate matrix pads, one in matrix 1002 and one in matrix 1006; also depicted is wire bond 1014 that interconnects two separate matrix pads, one in matrix 1006 and one in another matrix.

Further, a cross section of the SIP 1000 and a cross section 1030 of the leads 1032 are shown. Element 1040 depicts the plastic compound forming the SIP package depicted in FIG. 10. In this embodiment, the package 1000 contains the components and substrate and the plastic compound 1040. Element 1024 is a cross section of an active device or component and 1016 is a cross section of passive devices or components located on the surface of a matrix panel; 1020 is a cross section of a matrix panel 1002.

Figure 11:
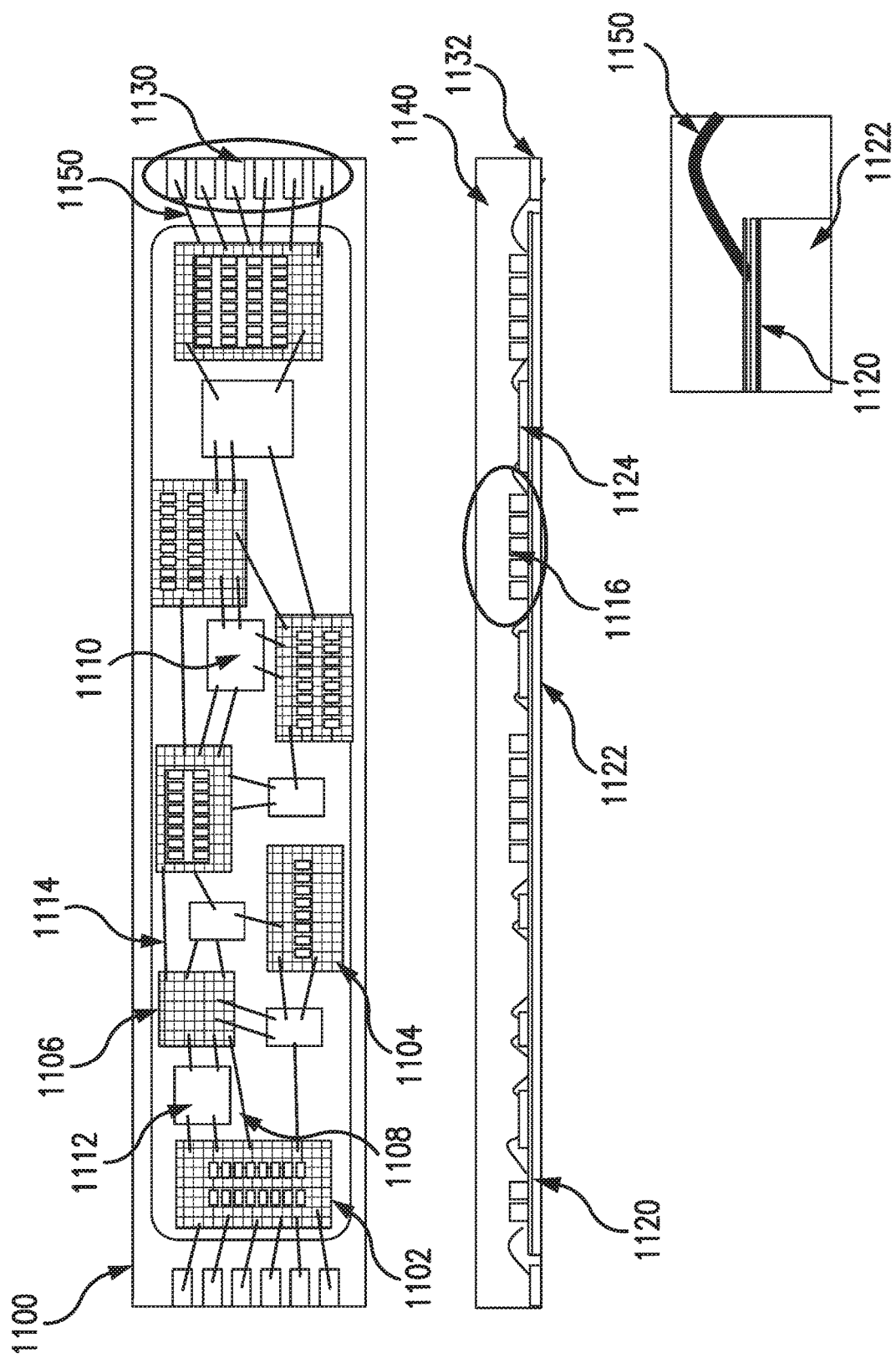
FIG. 11 is a diagram of a system in accordance with exemplary embodiments.

Referring now to FIG. 11, three views of a SIP 1100 using thumbnail matrix panels of the present disclosure are shown in an overview, a cross-sectional side view, and an exploded view in cross-section. More particularly, there is a metal substrate for structural support and a multi-layered substrate PCB film on top of the substrate. This embodiment uses interconnection matrix panels, as well as circuitization. For example, in SIP 1100, the substrate 1122 has circuitization 1120 that is interconnected with matrix panels. The substrate 1122 is preferably a blank metal substrate, but other materials that form a structural support for the SIP 1100 may be employed. The interconnection between active devices 1110, 1112 and passive components is accomplished by a set of matrix panels 1102, 1104, 1106, which have predetermined conductive patterns and form the matrix interconnection system, and/or through interconnections in the PCB circuitization layer 1120. In certain aspects, these panels are effectively small pieces of a PCB with the matrix pads and interconnections similar to those in the preceding embodiments, but on a much smaller scale, and can be attached to the substrate alongside other devices and passive components may be attached on the surface of these panels according to the specific requirement of the specific system. In some embodiments, each of the pre-circuitized "thumbnail" matrix panels 1102, 1104, 1106, may be provided as conductors on the surface, and when required, optionally in substrate layers below, in addition to the circuits available in the circuitization layer 1120. These interconnections can be further customized through bonding wires that can be bonded on the pre-existing arrays of pads on each matrix panel, e.g. using the pads (not depicted) on the surface of each matrix panel. A wire bond 1108 interconnects two separate matrix pads, one in matrix 1102 and one in matrix 1106; also depicted is wire bond 1114, which interconnects two separate matrix pads, one in matrix 1106 and one in another matrix.

Further referring to FIG. 11, a cross section of the SIP is depicted, including a cross section of the SIP 1100 and a cross section 1132 of the leads 1130. Element 1140 depicts a plastic compound forming the SIP package; the package 1100 contains the components and substrate and the plastic compound 1140. Element 1124 is a cross section of an active device or component and 1116 is a cross section of passive devices or components located on the surface of a matrix panel. Element 1120 is a cross section of a multilayered PCB tape, which may be used according to certain embodiments. In particular, the exploded view of FIG. 11 illustrates an exemplary manner in which external metal leads may be used for inputs and outputs, as well as the use of a multi-layered PCB tape 1120, as well as the substrate 1122 and bond wire 1150 for interconnecting the leads 1912 with PCB input/output pads.

According to certain aspects of the embodiment shown in FIG. 11, the circuitization is provided by a thin multilayer or single layer of PCB laminate 1120, which could be, for example, a polyimide or other material with conductive layers in it, like that of FIG. 8, which is attached on top of a metal or ceramic substrate 1122, in addition to the matrix panels 1102-1106. The external connection may be provided through a set of metal leads that are embedded in the molded body, also known as an encapsulation. Although the foregoing figures depict in symbolic form both passive and active components, it should be noted that any of those components, such as 1012, may be a small PCB with components mounted on it and/or a SIP. Similarly, any of the thumbnail matrices may have active and/or passive components mounted on it, and then appropriately interconnect with the other components associated with its PCB or substrate.

Figure 12:
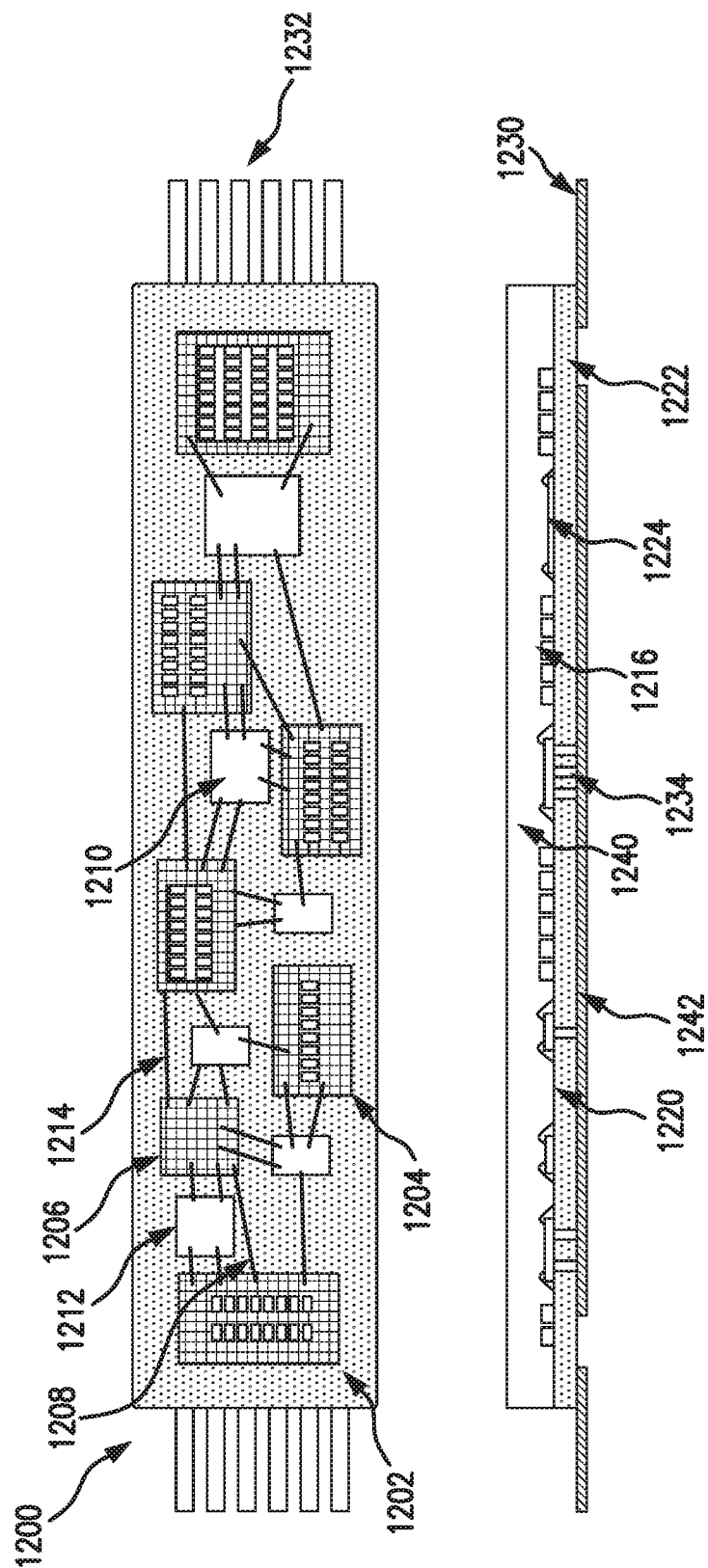
FIG. 12 is a diagram of a system in accordance with exemplary embodiments.

Referring now to FIG. 12, two views of a SIP 1200 using matrix interconnections and a ceramic substrate using external metal leads are shown in an overview and in a cross-sectional side view. In the embodiment of FIG. 12, the substrate 1222 may be made of a plastic laminate material which contains two or more conductive layers which form a fixed circuitization, with interconnection matrices 1202, 1204, 1206, which allow for interconnections that can be further customized through bonding wires that can be bonded on the pre-existing arrays of pads on each interconnection matrix, e.g. using pads on the surface of each interconnection matrix in a manner similar to that described earlier herein with regard to FIGS. 5A and 5B. High temperature tolerant substrate, encapsulant and other materials may be used to make the package rugged. External leads 1232 can be attached, e.g., soldered, to terminals on the substrate. In certain aspects, the leads are not embedded in the plastic. The interconnection between active devices 1210, 1212 and passive components is accomplished by a set of interconnection matrices 1202, 1204, 1206, which have predetermined conductive patterns and form the matrix interconnection system of the present disclosure, and through the standard interconnections available in the PCB circuitization layer 1220 that are available to be used by individual components and/or the interconnection matrices. In some embodiments, each of the interconnection matrices 1202, 1204, 1206, may be provided as conductors on the surface in addition to the standard circuit interconnections available in the standard circuitization layer 1220. These interconnections can be further customized through bonding wires that can be bonded on the pre-existing arrays of pads on each interconnection matrix, e.g. using the pads on the surface of each interconnection matrix. A wire bond 1208 interconnects two separate interconnection matrix pads, one in interconnection matrix 1202 and one in interconnection matrix 1206; also depicted is wire bond 1214 that interconnects two separate interconnection matrix pads, one in interconnection matrix 1206 and one in another interconnection matrix.

Further referring to FIG. 12, a cross section of the SIP having a multilayered PCB circuitization layer 1220 is shown. In certain aspects, it provides standard conductive routings. A cross section of SIP 1200 and a cross section 1230 of the leads 1232 are shown. Element 1240 depicts the plastic compound forming the SIP package, containing the components and substrate and the plastic compound 1240. Element 1224 is a cross section of an active device or component, which may be, for example, a SIP. Element 1216 is a cross section of passive devices or components located on the surface of a matrix panel. Element 1220 is a cross section of a multilayered PCB tape like, for example, that depicted in FIG. 8. In addition several thermal vias 1234 are depicted and an optional heat spreading dissipation layer 1242 on the very bottom of the package 1200. A high temperature molding compound can be used to embed the high temperature PCB substrate and its components. In addition, a thermal via and heat sink materials are shown.

In the embodiments of FIG. 12, the substrate 1220 may be made of plastic laminate material which contains two or more conductive layers which form the PCB circuitization that has interconnection matrices of the present disclosure on the surface. High temperature tolerant substrate, encapsulant and other materials may be used to make the package rugged. A metal plate may be attached as a heatsink at the bottom using non-electrically conducting but thermally conducting interface material. Additionally, thermal vias can be strategically placed to dissipate heat from components that need cooling. In certain aspects, external leads are soldered to terminals on the substrate.

Figure 13:
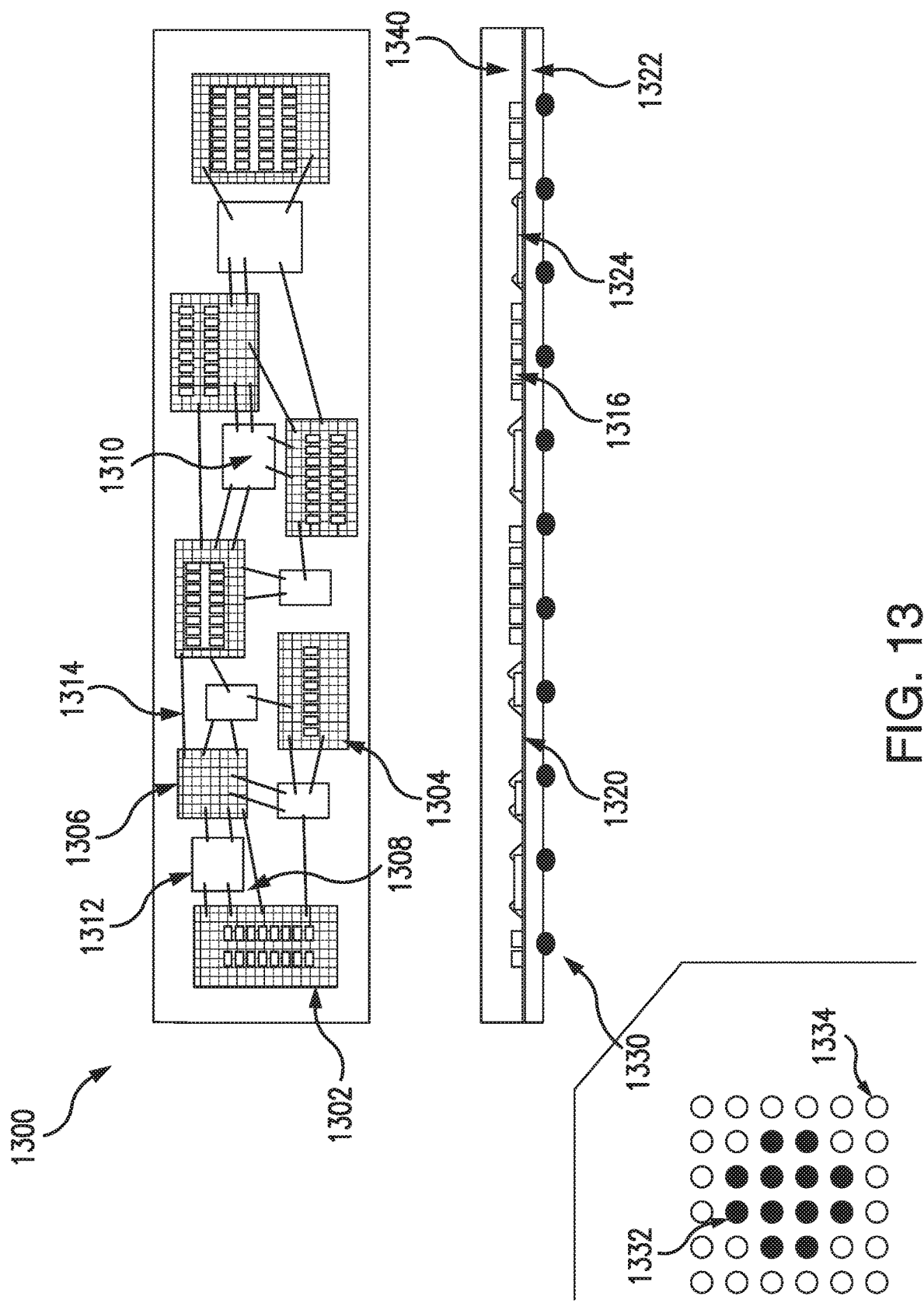
FIG. 13 is a diagram of a system in accordance with exemplary embodiments.

Referring now to FIG. 13, three views of a SIP 1300 using matrix interconnections and a PCB base are shown in an overview, a cross-sectional side view, and an enlarged partial bottom view. In the embodiment of FIG. 13, the substrate 1322 is made of plastic laminate material which preferably contains two or more conductive layers that form a fixed circuitization, with interconnection matrices 1302, 1304, 1306, which allow for interconnections that can be further customized through bonding wires that can be bonded on the pre-existing arrays of pads on each interconnection matrix, e.g. using pads on the surface of each interconnection matrix in a manner similar to that described earlier herein with regard to FIGS. 5A and 5B. According to certain aspects, high temperature tolerant substrate, encapsulant and other materials can be used to make the package rugged. External connections can be made using balls 1330 located on the bottom of the substrate 1322. The interconnection between active devices 1310, 1312 and passive components can be accomplished by a set of interconnection matrices 1302, 1304, 1306, which have predetermined conductive patterns and form the matrix interconnection system of the present disclosure, and through the standard interconnections available in the PCB circuitization layer 1322 that are available to be used by individual components and/or the interconnection matrices. According to certain aspects, each of the interconnection matrices 1302, 1304, 1306, may be provided as conductors on the surface in addition to the standard circuit interconnections available in the standard circuitization layer 1322. These interconnections can be further customized through bonding wires that can be bonded on the pre-existing arrays of pads on each interconnection matrix, e.g. using pads on the surface of each interconnection matrix. A wire bond 1308 interconnects two separate interconnection matrix pads, one in interconnection matrix 1302 and one in interconnection matrix 1306; also depicted is wire bond 1314 that interconnects two separate interconnection matrix pads, one in interconnection matrix 1306 and one in another interconnection matrix. According to some embodiments, the substrate is made of plastic laminate material which contains two or more conductive layers which form the PCB circuitization, and a metal plate may be attached as a heatsink at the bottom using non-electrically conducting but thermally conducting interface material. Additionally thermal vias are strategically placed to dissipate head from components that need cooling.

Further referring to FIG. 13, a cross section of the SIP 1300 is shown, and 1340 depicts the plastic compound forming the SIP package. In certain aspects, it depicts the package 1300 containing the components and substrate and the plastic compound 1340. Element 1324 is a cross section of an active device or component and 1316 is a cross section of passive devices or components located on the surface of a matrix panel. Element 1320 is a cross section of a multilayered PCB tape. High temperature molding compound can used to embed the high temperature PCB substrate 1322 and its components.

Regarding the BGA balls for the SIP 1300 of FIG. 13, they are separately depicted, as a portion of the balls can be used as external electrical connectors 1332, and others may be used for mechanical or structural connectors 1334. The signals and power rails may be connected to any external circuit of the system by use of standard interconnect methods. In FIG. 13, these connections can be made with a ball grid array rather than leads. Alternatively, pins may be employed rather than balls.

Figure 14:
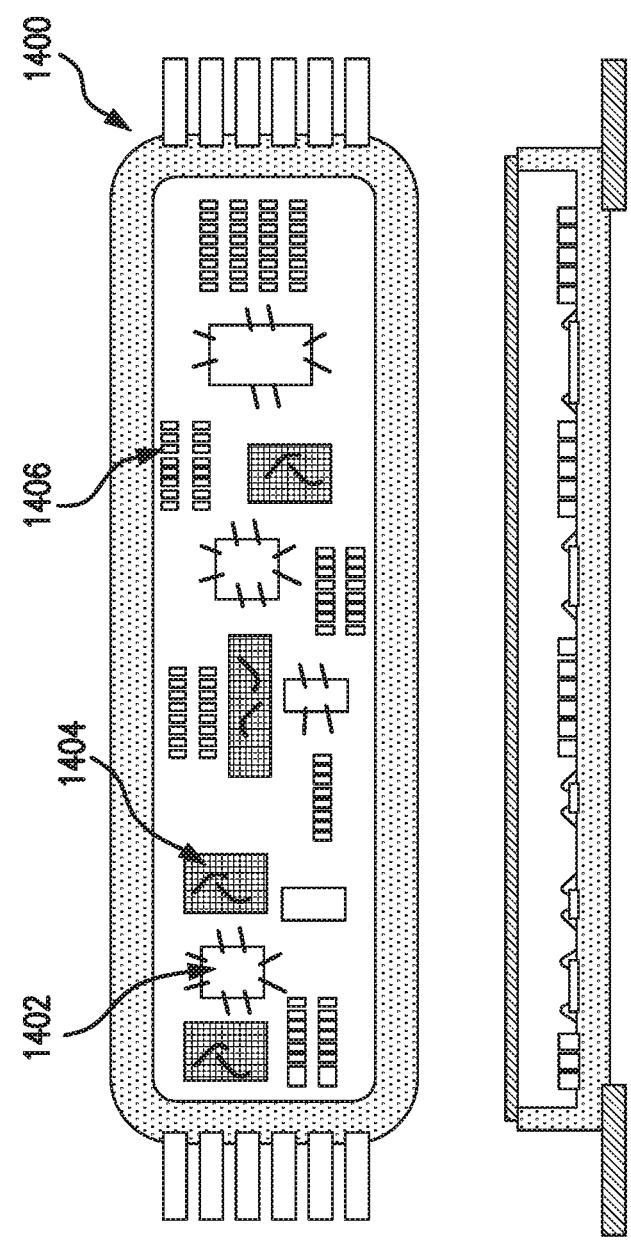
FIG. 14 is a diagram of a system in accordance with exemplary embodiments.

Referring now to FIG. 14, two views of a SIP 1400 using an interconnections matrix are shown in an overview and a cross-sectional side view. The SIP of this embodiment is preferably an analog only sub-system, and depicts a representative active component 1402, e.g., an operational amplifier, interconnection matrix 1404, and passives 1406. Other components, interconnection matrices, and passives are depicted but not labelled in the figure. The flexible interconnection embodiments of the present disclosure allow for the reprogramming this SIP depending upon the sub-system and overall system needs and the components selected to be used on a standard substrate of the present disclosure for a family of analog subsystems. A cross section of the SIP 1400 is also provided in FIG. 14.

In this configuration, the SIP 1400 is built using PCB material, which material may utilize high temperature laminate materials. The encapsulant may further be of high temperature tolerant material. External connection from the SIP may be through solder balls or leads attached at the bottom of the SIP package. Special consideration is preferably given to the material and placement of solder balls or leads in view of harsh environment in a downhole application. Solder material can be utilized as appropriate to the application and may be high Pb, Sn—Pb, Sn—Cu, SnAg, SnAgCu, polymercore solder coated ball, or any of other alloys that provide higher strength at elevated temperatures. Further, the placement of any solder ball array is preferably such that a set of solder balls are dedicated as purely structural members whereas another set of solder balls is used for electrical connection. The structural members are situated in strategically selected locations of the package to provide maximum structural protection without affecting electrical connectivity. The electrical balls are situated at strategic locations which are in lower stress areas or are shielded by other structural solder balls.

Figure 15:
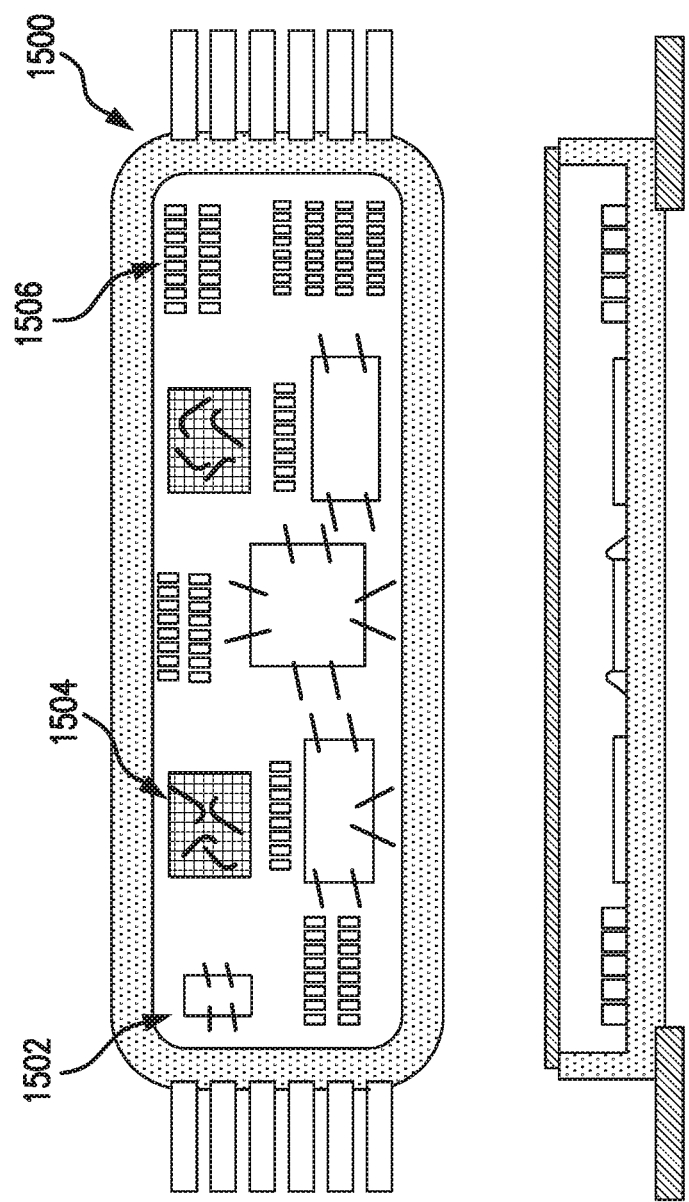
FIG. 15 is a diagram of a system in accordance with exemplary embodiments.

Referring now to FIG. 15, two views of a SIP 1500 using matrix interconnections are shown in an overview and a cross-sectional side view. The SIP of this embodiment is preferably a memory and processor only sub-system, having an active component with bond wires 1502, interconnection matrix 1504, and passives 1506. Other active components, interconnection matrices, and passives are depicted but not labelled in FIG. 15. The flexible interconnection embodiments of the present disclosure allow for the reprogramming of this SIP depending upon the sub-system and overall system needs and the components selected to be used on a standard substrate of the present disclosure for a family of memory and processor subsystems. As shown in the cross section of FIG. 15, the layers in package 1500 are similar to those depicted in other figures herein, and each of the modules in FIGS. 14 and 15 are similar to the systems or subsystems discussed earlier herein and may utilize the teachings of those figures and related disclosures.

The subsystems provided by embodiments of the present disclosure allow for a family of subsystems that use one substrate/PCB for multiple subsystem choices depending on the functions needed, or temperature issues, or the size of the components when variable pad sizes may be utilized. For example, one such family of subsystems could be for operational amplifiers so there may be different amplifier sizes and different amplifier configurations depending upon the final wire bonding used as part of the final assembly, but all using the same basic standard amplifier substrate. Similarly, there may be a family of subsystems for analog to digital (A/D) and/or digital to analog (D/A) using different A/Ds and different A/D configurations, but using the same standard substrate for the A/D family. Similarly, there may be a family of subsystems for power systems and a family of subsystems for sensors that allow for different power systems and different power system configurations and different sensors and different sensor configurations using a standard substrate of the present disclosure for its respective subsystem family. Similarly, a power management subsystem may include power management (i.e., a PMIC), power generation (e.g., solar cell, thermal or mechanical means for converting non-electrical energy to electrical energy), and energy buffering (batteries or capacitors).

Figure 16:
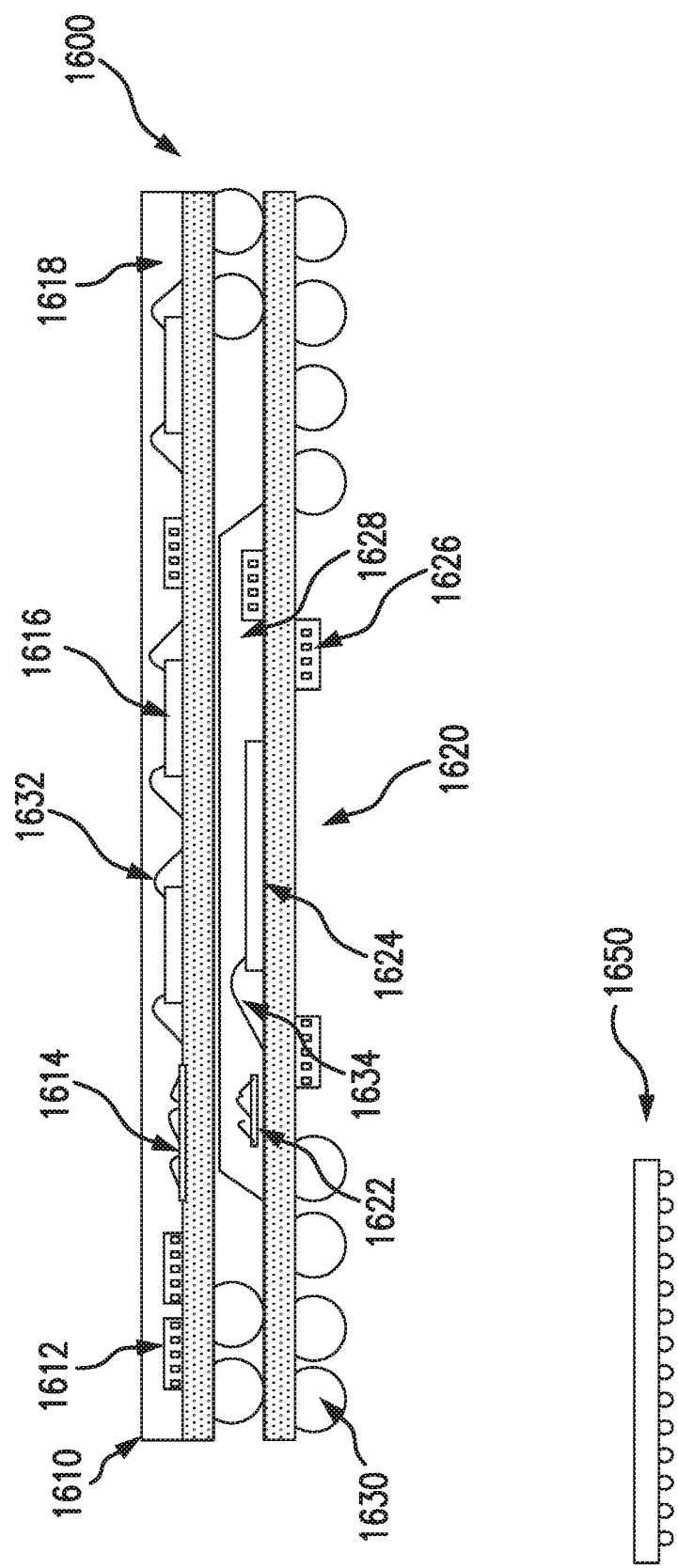
FIG. 16 is a diagram of a system in accordance with exemplary embodiments.

Referring now to FIG. 16, two views of a cross-section of one embodiment of a system SIP 1600 for stacking multiple subsystem or subgroup SIPs in a single package are shown. Although only two are depicted, this configuration may be further repeated and stacked for a larger number of subsystems. In this embodiment, both SIP substrates 1610, 1620, are using a ball grid array 1630 for input/output connections. FIG. 16 depicts active devices 1616, 1624, passive devices 1612, 1626, and interconnection matrices 1614, 1622, with bond wires. FIG. 16 also depicts bond wires 1632, 1634, for interconnecting components to their respective substrate. In addition, a molded cap 1628 may be provided over a portion of the components on the lower substrate 1620 and mold compound 1618 over the upper substrate 1610. In certain aspects, there may be passives on both sides of the substrates. Also, the lower substrate 1620 may use a flip chip 1650 rather than the active component 1624 depicted in FIG. 16. Distributed interconnection matrix sections are shown as 1614, 1622. Preferably, the balls, when used, include both electrical and mechanical or structural balls. According to some embodiments, a method provides for combining various sub-systems or subgroups to form a downhole system. The arrangement of FIG. 16 is an embodiment that provides a three dimensional interconnect to form a compact system. This arrangement method may utilize both top and bottom surfaces of a substrate of a sub-system or subgroup in a package to make connections. Stacked arrangement may be particularly well suited for applications with limited space, such as down-hole environments.

Figure 17:
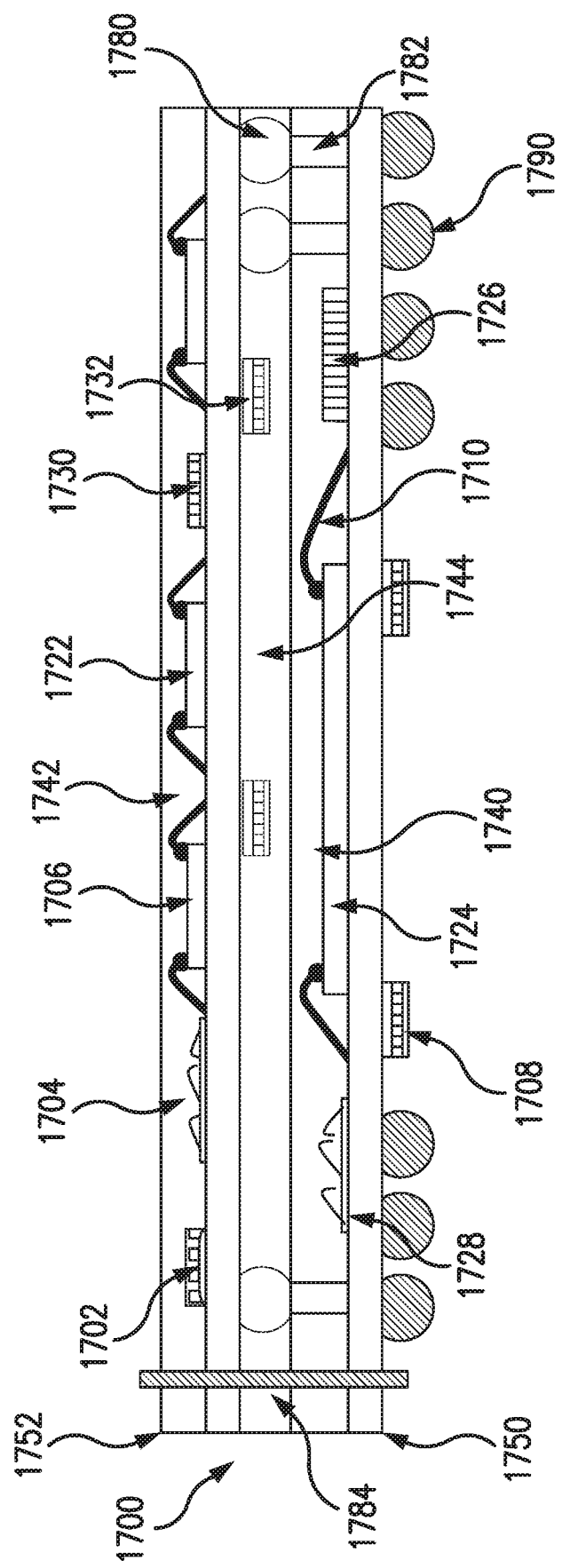
FIG. 17 is a diagram of a system in accordance with exemplary embodiments.

Referring now to FIG. 17, there may be seen a cross-section of a SIP 1700 for mounting multiple SIPs in a single package, according to certain embodiments. FIG. 17 shows a stack of two substrates 1750, 1752, but any number of substrates may be so stacked in accordance with the methods and apparatus of the present disclosure. In this example, both SIP substrates 1750, 1752, are using a ball grid array 1780, 1790 for input/output connections. FIG. 17 further depicts active devices 1706, 1722, 1724, passive devices 1702, 1708, 1726, 1730, 1732, and interconnection matrices 1704, 1728, with bond wires. FIG. 17 also depicts bond wires 1710 for interconnecting components to their respective substrate. In addition, there may be a mold compound 1740 over the components on the lower substrate 1752 and mold compound 1742 over the upper substrate 1750. In certain aspects, there may also be underfill material 1744 between the two substrates and a representative pin joint 1784 between two BGA balls for mechanically attaching the two substrates together. In a similar manner, there may be a thru package via 1782 for making electrical contact between the balls of the upper substrate 1750 and the balls of the lower substrate 1752. Preferably, when only the balls are used, they include both electrical and mechanical or structural balls.

One issue with stacked packages can be structurally keeping them together. The embodiment of FIG. 17 illustrates how this could be done with balls by including both electrically conductive balls and structural balls. Another solution is to use through-hole pins to both make the electrical connection or the structural connection as depicted in FIG. 17. The pins may be bent over on the top and bottom of the substrate stack before soldering so that the pins have more mechanical strength. A further embodiment has both sides of each of the substrates encapsulated in such a way that the encapsulation would strengthen the stack. This could be accomplished by having the two adjoining encapsulations in physical contact, and optionally further including a glue or cement to provide permanent attachment. For instance, a second encapsulation 1744 can be been added to the bottom of the top substrate 1750 in FIG. 17. This encapsulant would not necessarily cover the balls, and would not be an issue with respect to any through-hole pins used. Distributed interconnection matrix sections 1704, 1728, are depicted in FIG. 17. The pins are suitable for keeping the stack together when it may be subject to forces that may cause it to delaminate. The balls and the encapsulants may be suitably selected for when the package will be subjected to high pressures and/or high temperatures.

Figure 18:
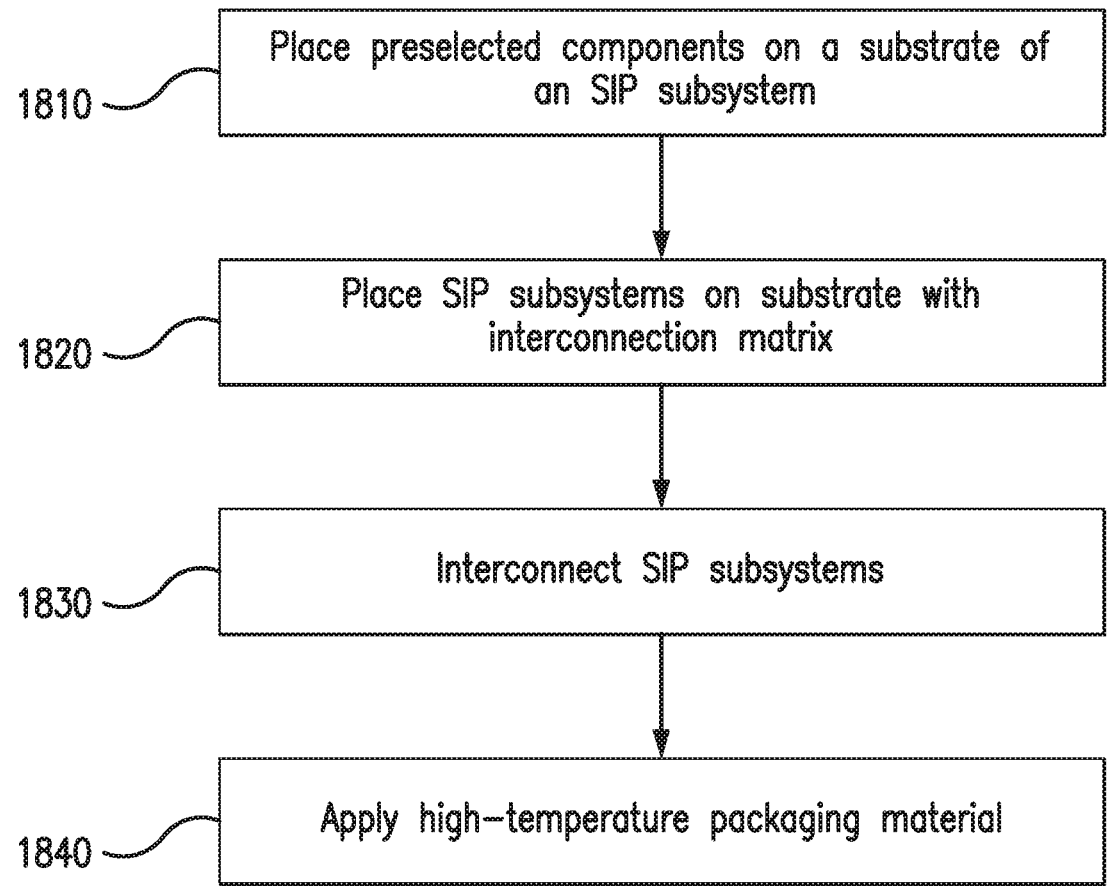
FIG. 18 is a flow chart of a method in accordance with exemplary embodiments.

Referring now to FIG. 18, and according to some embodiments, a method 1800 is provided for configuring a system. In step 1810, preselected components are placed on a plurality of SIP subsystem, for instance, as shown with respect to FIGS. 5A, 5B, and 9-17. According to certain aspects, each SIP subsystem may be preselected from a family of SIP subsystems, with each family having predetermined functions depending on which preselected components are placed thereon and the interconnections between the components on each SIP. In step 1820, the SIP subsystems can be placed on a substrate with an interconnection matrix, for instance, as shown with respect to FIGS. 5A, 5B, and 9-17. In step 1830, the SIP subsystems are interconnected. This may be done independently of each subsystem that is selected from that subsystems family to predetermine the desired overall characteristics and features of the system. The SIP subsystems may be interconnected using the interconnection matrix, for instance, as illustrated with respect to FIGS. 5A, 5B, and 9-17. The method 1800 may further include applying 1840 a high temperature plastic packaging material, where the packaging material is configured for use in high pressure and high temperature environments. Example applications include one or more of downhole oil and gas applications, automotive applications, aerospace applications, chemical and refining process plant applications, and power generation applications.

According to certain embodiments, in the method 1800, the step 1820 may be omitted such that the SIP subsystems are directly connected. This may be, for instance, in a stacked configuration as shown with respect to FIG. 17. As such, embodiments provide for a method 1800 that includes placing (1810) preselected components on a plurality of SIP subsystems. In certain aspects, each SIP subsystem may be preselected from a family of SIP subsystems with each member of the family using a common substrate having at least one interconnection matrix and having predetermined functions depending on which preselected components are placed on the substrate and the interconnections between said components of each subsystem. The method may further include interconnecting (1830) at least two of the plurality of SIP subsystems to define a desired overall characteristic of the system.

Embodiments of the present disclosure provide methods for configuring a system by placing components on a plurality of SIP subsystems, with each SIP subsystem preselected from a family of SIP subsystems with each family having predetermined functions depending on which components are placed thereon, placing the subsystems on a system substrate with an interconnection matrix, and interconnecting the SIP subsystems independently of each subsystem that is selected from that subsystems family to predetermine the desired overall characteristics and features of the system.

Embodiments of the present disclosure may be employed in multiple severe and/or harsh environmental conditions, such as in environmental conditions of high temperatures, or high pressures, or combinations of any or all of these severe conditions. Examples are down-hole applications for the oil and gas industry or automotive engine or transmission applications for the automotive industry. Using the down-hole example as an illustration, down-hole electronic systems can be made up of several sub-groups of systems such as an analog system, Analog-to-digital (A-D) conversion system, power-supply management system, customization system, microprocessor system, sensor system, etc. The primary function of these sub-systems may be to receive input from various sensors such as temperature, pressure, position, etc., and process them digitally and allow the system to make decisions regarding down-hole operating conditions while drilling. In some respects, each drilling electronics system has its unique processing, analog, A-D, and power management system.

Embodiments of the present disclosure can address such applications, for instance, by dividing a typical electronics system into groups of subsystems. For example, analog systems may be considered as A1, A2, A3 and A-D systems can be D1, D2, D3, and similarly, power supply modules can be P1, P2, P3. Using these nine exemplary subsystems, one can support 27 different and unique downhole systems by making the system from different combinations of the subsystems, which allows for a much faster and cheaper way of building the electronics of a downhole system. The use of these groups of subsystems also allow for redundancy in the overall system. For example, a sensor in a downhole application may supply its output signal to several different active components, such as operational amplifiers, that are working in parallel and each component then sends its respective signal (which should be the same signal) to several independent channels of a multichannel A/D. The multichannel A/D then outputs these individual signals (which should be the same signal) for input into a microprocessor or controller for analysis and further processing. If one of the components fails, the microprocessor or controller may be configured to detect this failure by analysis of a received faulty or missing signal, and be programmed to ignore that faulty signal. This redundancy allows for a repair to be made while the system is still downhole, by ignoring the faulty signal. The present invention allows for such parallel signal paths, or redundancy, as a result of its small size, reduced costs, and its subsystem programmability provided by the wire bonding of the components using the interconnection matrices or matrix.

Figure 19:
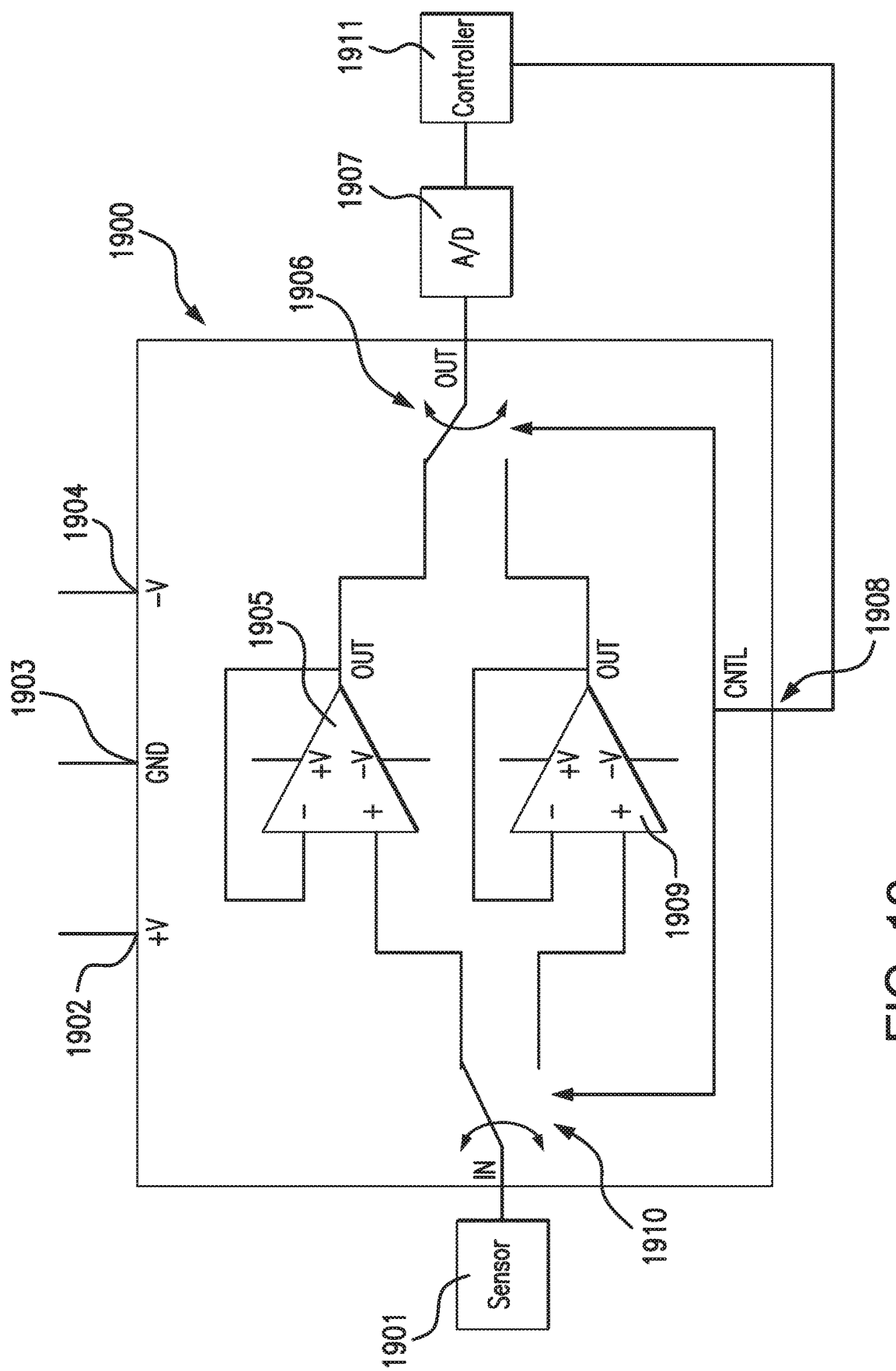
FIG. 19 is a circuit diagram of a system in accordance with exemplary embodiments.

Referring now to FIG. 19, there may be seen a simplified circuit of one example of a portion of a subsystem that illustrates an operational amplifier (OpAmp) circuit 1900 that is configured to provide redundancy. The subsystem may be used to amplify the signal from a sensor 1901. Accordingly, the sensor output may be supplied as the input of the redundant OpAmp circuit 1900 and the amplified signal provided as an output to an Analog to Digital Converter (A/D) 1907; the output from the A/D may then in turn be provided to a controller 1911. Although more circuitry can be involved, for ease of illustration purposes, only particular features of the subsystem are depicted in FIG. 19. One aspect of the redundant OpAmp circuit 1900 is that it consists of two OpAmps 1905, 1909 and two analog switches 1906, 1910. Other aspects may employ more than two OpAmps for more redundancy. In this example, one analog switch 1910 is attached to the sensor output and determines which one of the two OpAmps receive the sensor's output as its inputs. The control line 1908 may then be used to control switch 1910 to determine which of the two OpAmps 1905 or 1909 is connected with the sensor 1901. The outputs of the two OpAmps 1905, 1909 are similarly connected to the other analog switch 1906. The analog switch is also connected to the A/D 1907 through the output of the redundant OpAmp circuit. Finally, the same control line 1908 may control which of the two OpAmps' output is connected to the A/D 1907. In operation, although both OpAmps are powered, only one of the two OpAmps may be functional at a time for amplifying the sensor signal. According to some embodiments, if at any time the output of the A/D 1907 is suspected to be erroneous or corrupted by the controller 1911, the controller can activate the control line 1908 to disconnect the suspected bad OpAmp and replace it with the other (second) OpAmp. In a similar fashion, the sensor 1901 and the A/D 1907 may be configured with redundant sensors and/or A/Ds, respectively, with separate control lines from the controller 1911 for the sensors and A/Ds. In this example, the positive voltage supply 1902 is connected to the positive voltage inputs to the two OpAmps 1905, 1909, and the negative voltage supply 1904 is connected to the negative voltage inputs to the two OpAmps. Additionally, ground (GND) 1903 may be available to the circuit to be used as needed.

Figure 20:
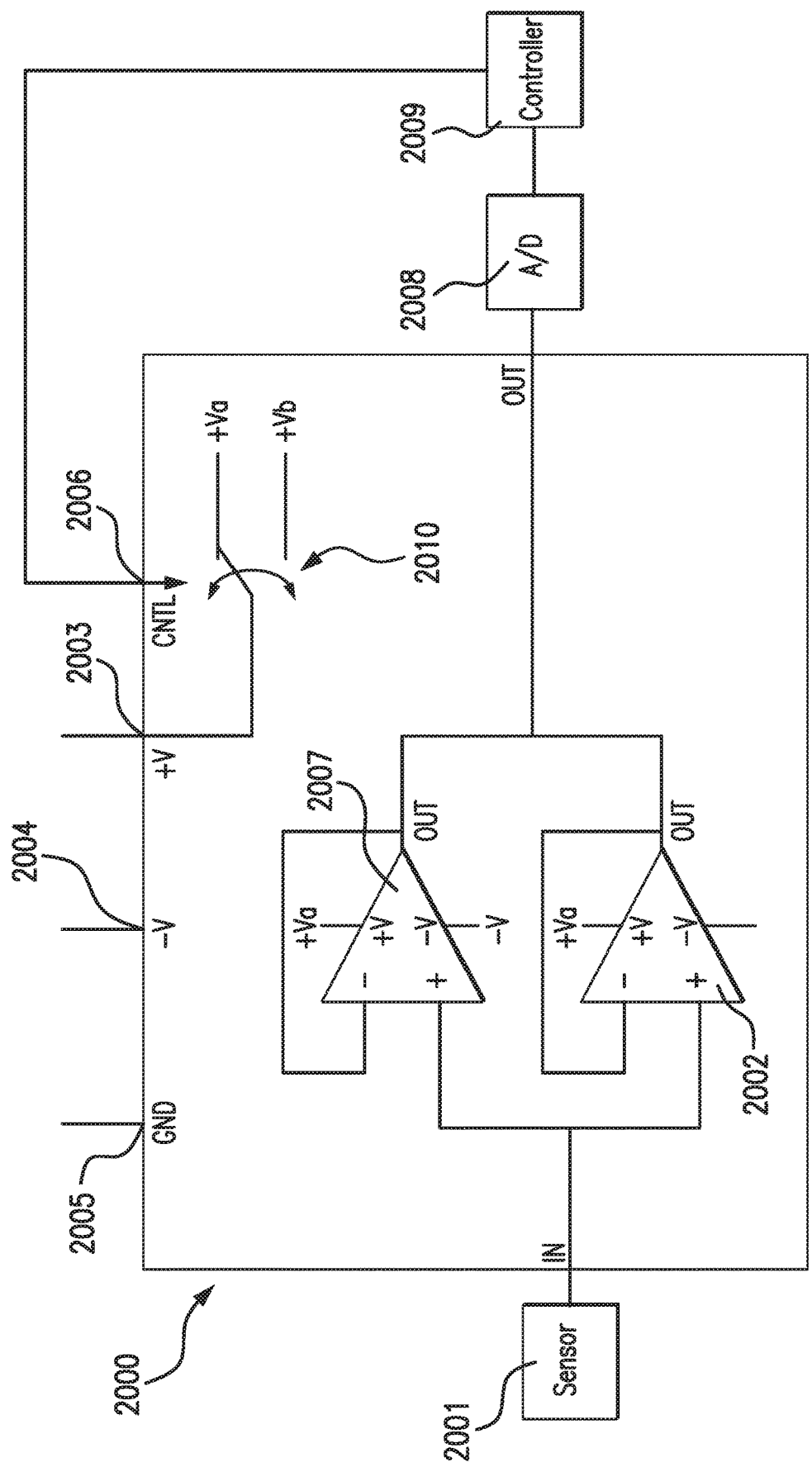
FIG. 20 is a circuit diagram of a system in accordance with exemplary embodiments.

Referring now to FIG. 20, there may be seen an alternative simplified circuit of one example of a portion of a subsystem that illustrates an operational amplifier (OpAmp) circuit 2000 that is configured to provide redundancy, in accordance with certain embodiments. In this example, circuit 2000 has a sensor 2001 attached to the positive inputs of both OpAmps 2007, 2002 and has the outputs of both OpAmps 2002, 2007 directly connected to the A/D 2008. Although more circuitry can be involved, for ease of illustration purposes, only particular features of the subsystem are depicted in FIG. 20. Both OpAmps receive negative voltage from the negative voltage supply 2004 and the ground (GND) 2005 may be available for use in the circuit as needed. According to certain embodiments, analog switch 2010 determines which of the two OpAmps 2002, 2007 is fully powered by connecting the OpAmp positive power input to the positive voltage supply 2003. If at any time the output of the A/D 2008 is suspected to be erroneous or corrupted by the controller 2009, the controller can activate the control line 2006 to disconnect the suspected bad OpAmp positive power supply and replace it by supplying positive power to the other (second) OpAmp. By doing so, the first OpAmp is powered down and the second OpAmp is powered up. In a similar fashion, the sensor 2001 and the A/D 2008 may be configured with redundant sensors and/or A/Ds, respectively, with separate control lines from the controller 2009 for the sensors and A/Ds.

Because failures of semiconductor components can be a function of the temperature that the semiconductor is exposed to, and/or the amount of current operating that component, the removal of power from parallel redundant circuits is a method of providing redundancy in accordance with certain embodiments.

In addition, certain embodiments may connect parallel, duplicate chains of a single sensor connected to a single OpAmp that is connected to a single A/D, which is then switched with an analog switch to a controller. The analog switch determines which one of the parallel chains in powered up and supplies an input to the controller, with the controller controlling the switch using a control line it controls. Other aspects may employ such parallel chains but with switches at each major component's input and output under the control of a controller that determines which components (sensor, OpAmp, A/D, etc.) to employ. For certain environments, like automotive applications, for example, the controller may be a programmed CPU or other circuitry for making a decision for which components, circuits or SIPs are to be used. For other environments, like downhole of chemical process plants, the controller may be a human operator (backed up by a programmed CPU or other circuitry) for making a decision for which components, circuits or SIPs are to be used.

Plastic Integrated Circuit (IC) components and PCB assemblies may be susceptible to rapid degradation at high temperatures due to breakdown of commonly used polymers in plastics. For instance, many single chip IC components are built of commercial grade plastic and rated for an ambient temperature of between 85 C and 150 C, or occasionally, up to a 175 C maximum. Although ceramic packages can be used in some instances, they are heavy and are subjected to much higher inertial force under shock and vibration with a risk of solder joint failure, and also may contain a cavity susceptible to collapse under high pressure. Accordingly, common failures of electronic systems in harsh environments, such as downhole applications, are due to solder joint failures, degradation of organic material in an encapsulant and PCB, wire bond interconnect failure, and capacitor short. The embodiments set forth above, including but not limited to the stacked SIP arrangements, fault tolerant systems, and use of encapsulated substrates can address these issues. SIP by its very nature improves reliability by eliminating one layer of interconnects, such that die may be directly connected to the system level without need for an intermediate package. SIP systems are also smaller and lighter, and thus, experience less inertial stress that is induced from shock and vibration inherent in a down-hole environment. Moreover, plastic-based SIPs can be light and compact, and thus, better able to withstand extreme hydrostatic pressure in deep wells. A filled package (no cavity) may be particularly resistant to hydrostatic pressure.

While the present invention has been described with respect to the embodiments set forth above, the present invention is not necessarily limited to these embodiments. Accordingly, other embodiments, variations, and improvements not described herein are not excluded from the scope of the present invention. Such variations include but are not limited to new substrate material, different kinds of devices, not discussed, but well known in the semiconductor art that may be attached to a substrate, or new packaging concepts that may be employed. Although the present invention and its advantages have been described in detail, it should be understood that various changes, substitutions and alterations can be made herein without departing from the spirit and scope of the invention as defined by the appended claims.

The invention claimed is:

1. A configurable system, comprising:
   a plurality of electrical components, wherein at least one of said plurality of electrical components is an active component; and
   a substrate comprising an interconnection matrix having one or more matrix connection pads, wherein said substrate comprises:
   a first conductive layer on the surface of said substrate, wherein a portion of said first conductive layer defines one or more component mounting pads for a first set of said plurality of electrical components, each with one or more associated electrical connection pads, and wherein a different portion of said first conductive layer defines one or more surface mount device pads for a second set of said plurality of electrical components;

at least an additional second conductive layer within said substrate and spaced apart from said first conductive layer in an insulating manner; and fixed interconnections within said substrate and between preselected portions of said first and second conductive layers to interconnect one or more of said electrical connection pads and one or more of said surface mount device pads to said one or more matrix connection pads, wherein said one or more matrix connection pads of said interconnection matrix are arranged to provide configurable connections between two or more of said plurality of electrical components.

2. The configurable system of claim 1, wherein at least one of said surface mount device pads is a multi-sized pad configured for mounting devices of at least two different sizes.

3. The configurable system of claim 2, wherein said multi-sized pad comprises at least two spaced apart individual conductive areas for making interconnections with a component, with each conductive area having a plurality of contiguous connected physical portions of varying size to accommodate components of different sizes.

4. The configurable system of claim 2, wherein said multi-sized pad comprises at least two conductive areas, where at least one of said conductive areas has a telescoped shape.

5. The configurable system of claim 2, wherein said substrate further comprises at least one via located adjacent said multi-sized pad to provide electrical contact to one of the following: power, signal, and or ground.

6. The configurable system of claim 5, wherein said via is located adjacent a step in said multi-sized pad having a telescoped configuration.

7. A configurable system, comprising:

a plurality of electrical components;

substrate means for mounting and interconnecting said plurality of electrical components together to define the desired overall characteristics and features of said configurable system based on said interconnections and the functions of each of said components, wherein at least one of said plurality of electrical components is a SIP subsystem having predetermined functions;

wherein said SIP subsystem comprises a first conductive layer on the surface of a substrate of said SIP subsystem, wherein said SIP subsystem includes a subsystem interconnection matrix and a portion of said first conductive layer defines one or more connection pads associated with component mountings, and a different portion of said first conductive layer defines one or more pads for surface mount devices for said SIP subsystem;

at least an additional second conductive layer within said SIP subsystem substrate and spaced apart from said first conductive layer in an insulating manner; and fixed interconnections within said SIP subsystem substrate between preselected portions of said first and second conductive layers to interconnect at least a portion of said connection pads for component mountings and at least a portion of said surface mount device pads with connection pads associated with said interconnection matrix.

* * * * *